(12) United States Patent
Lin et al.

(10) Patent No.: US 10,804,153 B2
(45) Date of Patent: Oct. 13, 2020

(54) SEMICONDUCTOR DEVICE AND METHOD TO MINIMIZE STRESS ON STACK VIA

(71) Applicant: STATS ChipPAC Pte. Ltd., Singapore (SG)

(72) Inventors: Yaojian Lin, Singapore (SG); Seng Guan Chow, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 399 days.

(21) Appl. No.: 15/169,095

(22) Filed: May 31, 2016

(65) Prior Publication Data
US 2016/0276237 A1 Sep. 22, 2016

Related U.S. Application Data

(63) Continuation-in-part of application No. 14/305,560, filed on Jun. 16, 2014.

(51) Int. Cl.
*H01L 21/78* (2006.01)
*H01L 23/00* (2006.01)
(Continued)

(52) U.S. Cl.
CPC .......... *H01L 21/78* (2013.01); *H01L 21/4857* (2013.01); *H01L 21/561* (2013.01); *H01L 22/14* (2013.01); *H01L 23/49816* (2013.01); *H01L 23/49838* (2013.01); *H01L 23/562* (2013.01); *H01L 24/11* (2013.01); *H01L 24/13* (2013.01); *H01L 24/19* (2013.01); *H01L 24/96* (2013.01); *H01L 24/97* (2013.01); *H01L 21/568* (2013.01); *H01L 23/3128* (2013.01); *H01L 23/5389* (2013.01); *H01L 2224/024* (2013.01); *H01L 2224/0231* (2013.01); *H01L 2224/0239* (2013.01); *H01L 2224/0401* (2013.01); *H01L 2224/04105* (2013.01);
(Continued)

(58) Field of Classification Search
CPC ... H01L 2224/0401; H01L 2224/05017; H01L 2224/13024; H01L 2224/13027; H01L 2224/1308–13082
See application file for complete search history.

(56) References Cited

U.S. PATENT DOCUMENTS 6,143,396 A 11/2000 Saran et al.
6,500,751 B2 12/2002 Surprenant et al.
(Continued)

*Primary Examiner* — Tod T Van Roy
*Assistant Examiner* — Sean P Hagan
(74) *Attorney, Agent, or Firm* — Robert D. Atkins; Patent Law Group: Atkins and Associates, P.C.

(57) ABSTRACT

A semiconductor device has a semiconductor die. A first insulating layer is disposed over the semiconductor die. A first via is formed in the first insulating layer over a contact pad of the semiconductor die. A first conductive layer is disposed over the first insulating layer and in the first via. A second insulating layer is disposed over a portion of the first insulating layer and first conductive layer. An island of the second insulating layer is formed over the first conductive layer and within the first via. The first conductive layer adjacent to the island is devoid of the second insulating layer. A second conductive layer is disposed over the first conductive layer, second insulating layer, and island. The second conductive layer has a corrugated structure. A width of the island is greater than a width of the first via.

25 Claims, 23 Drawing Sheets

(51) Int. Cl.
  H01L 23/498 (2006.01)
  H01L 21/48 (2006.01)
  H01L 23/538 (2006.01)
  H01L 23/31 (2006.01)
  H01L 21/66 (2006.01)
  H01L 21/56 (2006.01)

(52) U.S. Cl.
  CPC ............... H01L 2224/05017 (2013.01); H01L 2224/05083 (2013.01); H01L 2224/05111 (2013.01); H01L 2224/05124 (2013.01); H01L 2224/05139 (2013.01); H01L 2224/05144 (2013.01); H01L 2224/05147 (2013.01); H01L 2224/05155 (2013.01); H01L 2224/05164 (2013.01); H01L 2224/05166 (2013.01); H01L 2224/05169 (2013.01); H01L 2224/05171 (2013.01); H01L 2224/05172 (2013.01); H01L 2224/05184 (2013.01); H01L 2224/11849 (2013.01); H01L 2224/12105 (2013.01); H01L 2224/13024 (2013.01); H01L 2224/13025 (2013.01); H01L 2224/13111 (2013.01); H01L 2224/13113 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/92 (2013.01); H01L 2224/94 (2013.01); H01L 2924/014 (2013.01); H01L 2924/0105 (2013.01); H01L 2924/01013 (2013.01); H01L 2924/01028 (2013.01); H01L 2924/01029 (2013.01); H01L 2924/0132 (2013.01); H01L 2924/01047 (2013.01); H01L 2924/01073 (2013.01); H01L 2924/01079 (2013.01); H01L 2924/01322 (2013.01); H01L 2924/04941 (2013.01); H01L 2924/059 (2013.01); H01L 2924/0535 (2013.01); H01L 2924/05042 (2013.01); H01L 2924/05432 (2013.01); H01L 2924/05442 (2013.01); H01L 2924/0635 (2013.01); H01L 2924/0665 (2013.01); H01L 2924/1033 (2013.01); H01L 2924/10252 (2013.01); H01L 2924/10253 (2013.01); H01L 2924/10272 (2013.01); H01L 2924/10322 (2013.01); H01L 2924/10324 (2013.01); H01L 2924/10329 (2013.01); H01L 2924/10335 (2013.01); H01L 2924/1205 (2013.01); H01L 2924/1206 (2013.01); H01L 2924/1207 (2013.01); H01L 2924/13091 (2013.01); H01L 2924/1421 (2013.01); H01L 2924/1433 (2013.01); H01L 2924/1434 (2013.01); H01L 2924/14335 (2013.01); H01L 2924/186 (2013.01); H01L 2924/351 (2013.01)

(56) References Cited

U.S. PATENT DOCUMENTS

| | | |
|---|---|---|
| 6,699,782 B2 | 3/2004 | Kim |
| 6,717,267 B1 | 4/2004 | Kunikiyo |
| 8,133,762 B2 | 3/2012 | Pagaila et al. |
| 2002/0027269 A1 | 3/2002 | Hashimoto |
| 2003/0203171 A1 | 10/2003 | Higashitani |
| 2005/0067707 A1 | 3/2005 | Hashimoto et al. |
| 2007/0075423 A1* | 4/2007 | Ke ............ H01L 24/03 257/737 |
| 2008/0182401 A1* | 7/2008 | Ke ............ H01L 24/11 438/614 |
| 2009/0079070 A1* | 3/2009 | Lin ............ H05K 3/3436 257/738 |
| 2010/0244239 A1 | 9/2010 | Bao et al. |
| 2011/0186987 A1* | 8/2011 | Wang ......... H01L 23/3192 257/737 |
| 2011/0233766 A1 | 9/2011 | Lin et al. |
| 2012/0025394 A1 | 2/2012 | Hirano et al. |
| 2012/0199967 A1 | 8/2012 | Stacey |
| 2012/0206891 A1 | 8/2012 | Yoshioka et al. |
| 2012/0211269 A1 | 8/2012 | Saitou et al. |
| 2012/0211900 A1* | 8/2012 | Choi .......... H01L 24/03 257/782 |
| 2013/0009286 A1* | 1/2013 | Kim ........... H01L 24/11 257/632 |
| 2013/0075924 A1 | 3/2013 | Lin et al. |
| 2013/0127060 A1 | 5/2013 | Aboush |
| 2013/0140691 A1 | 6/2013 | Bao et al. |
| 2013/0147031 A1 | 6/2013 | Chen et al. |
| 2013/0249080 A1 | 9/2013 | Lin et al. |

* cited by examiner

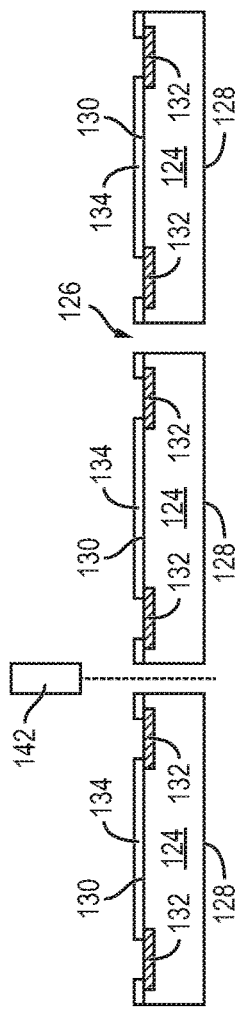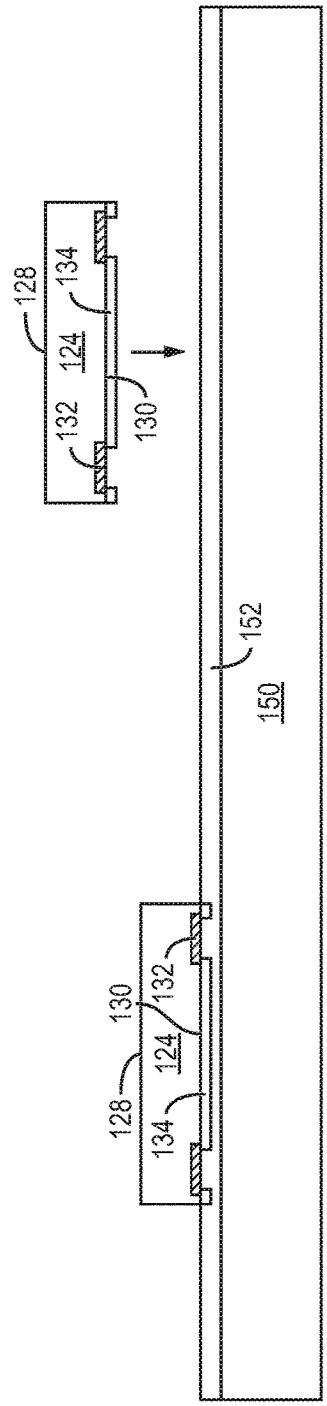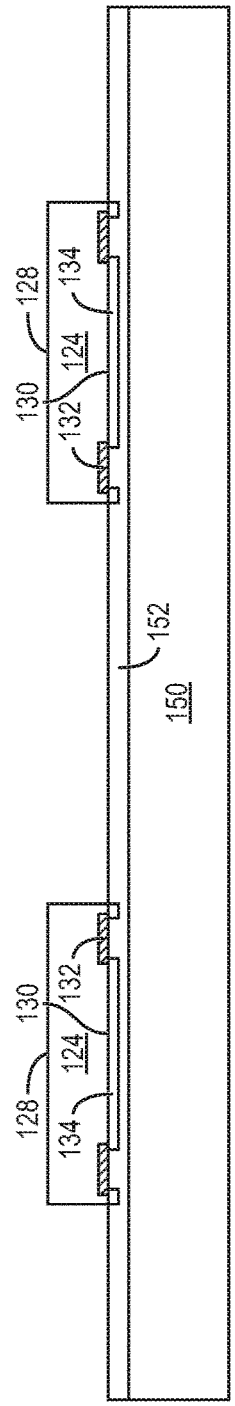

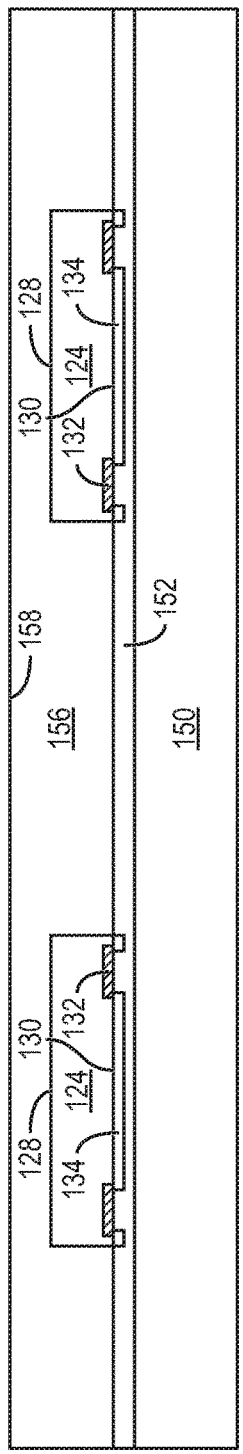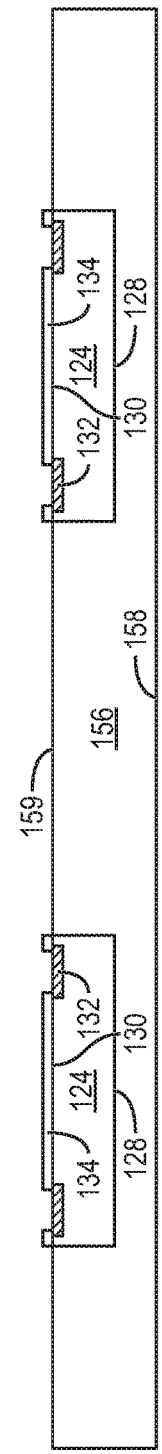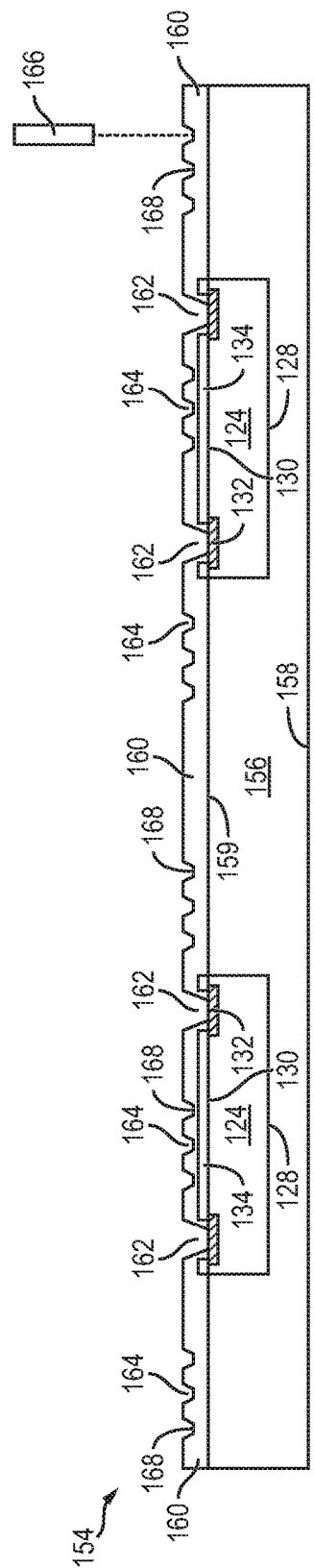

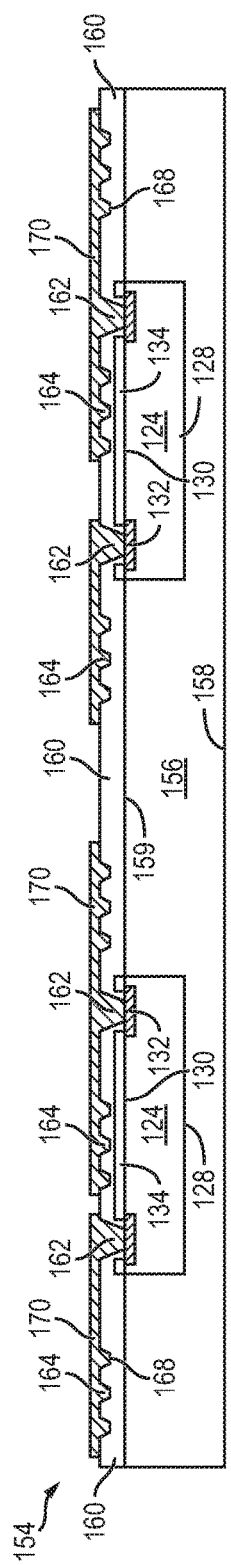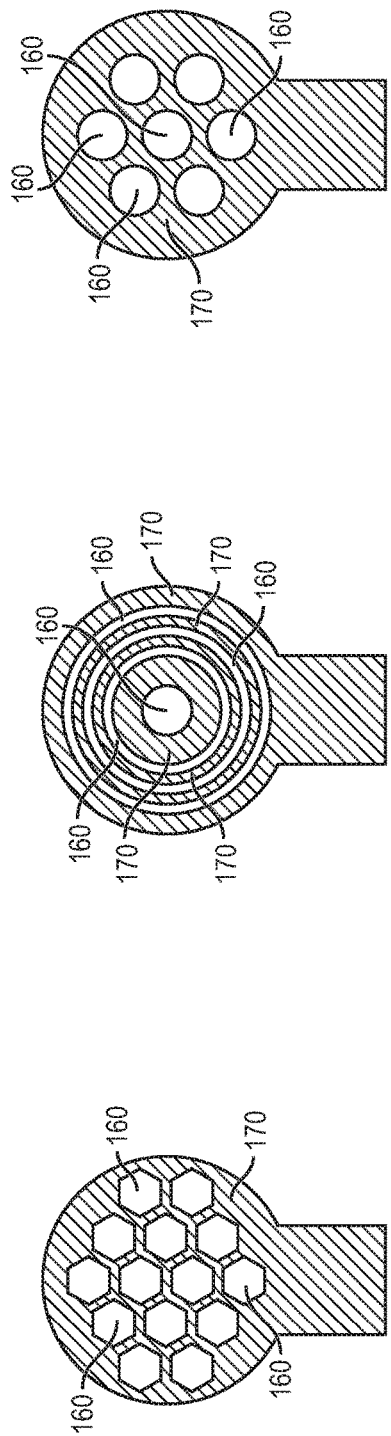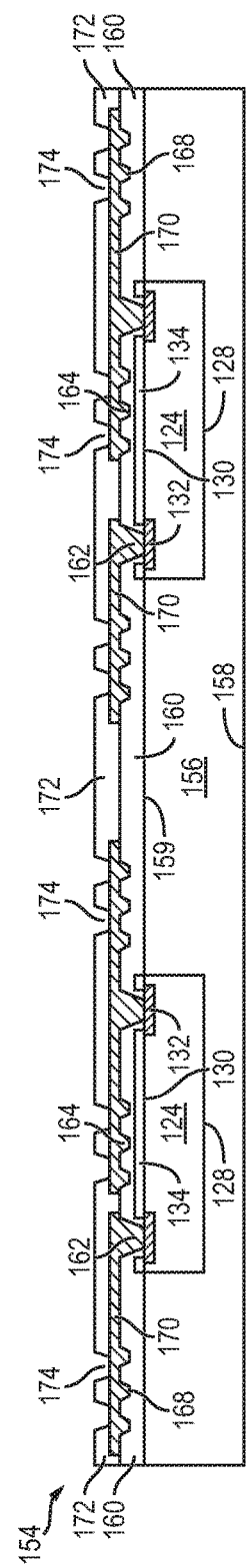

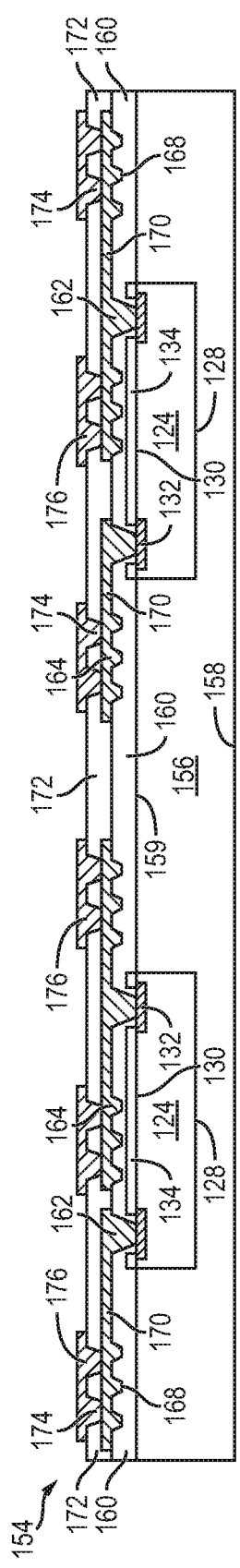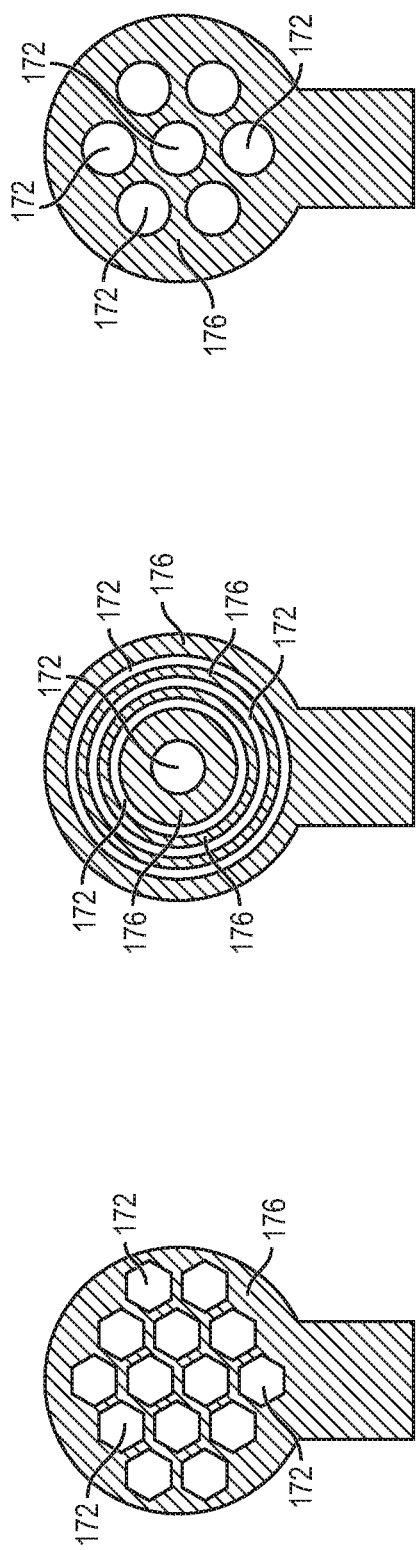

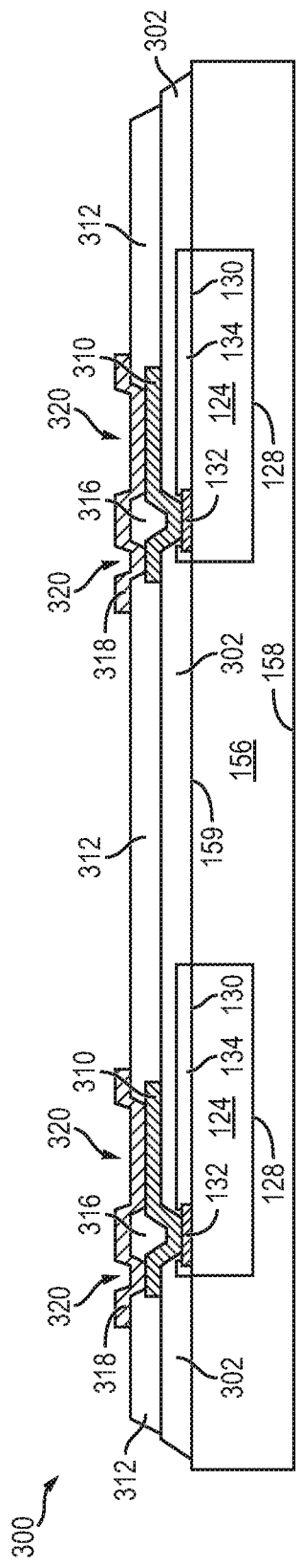
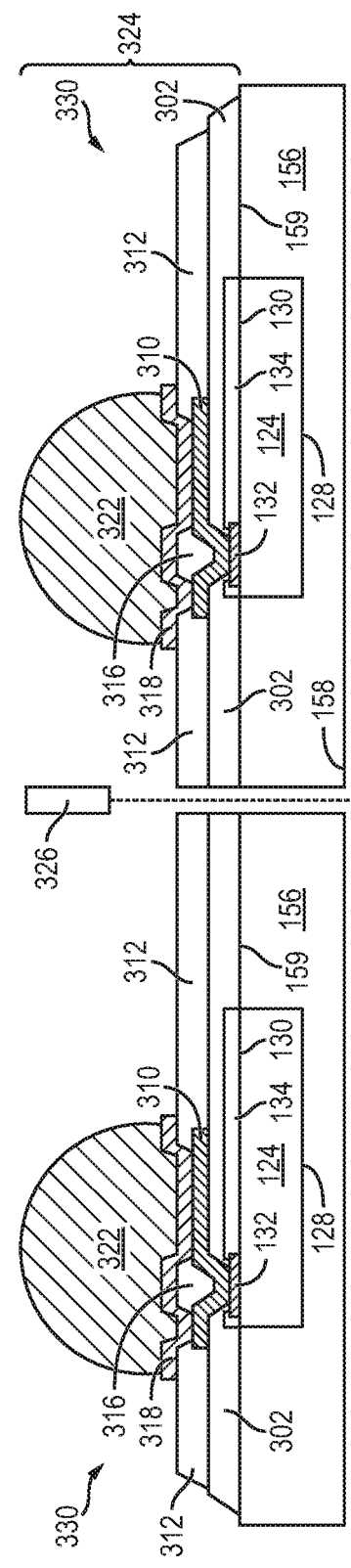
FIG. 11e
FIG. 11f

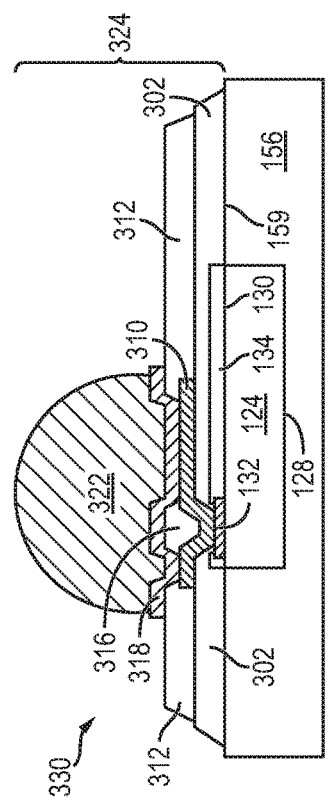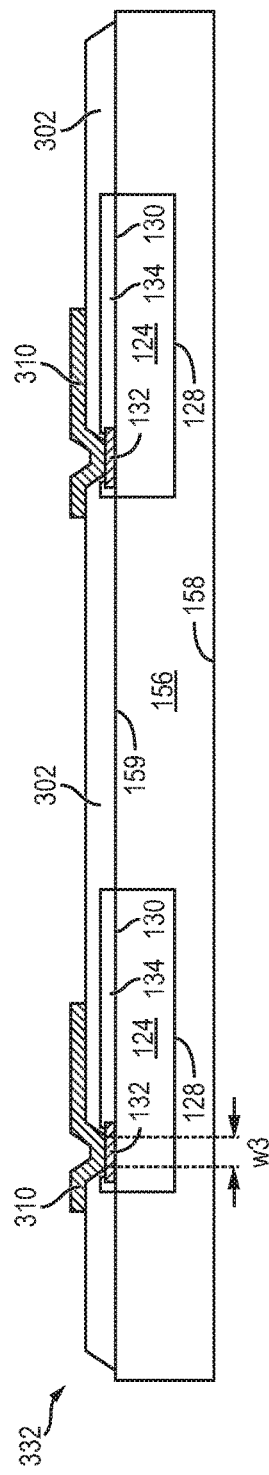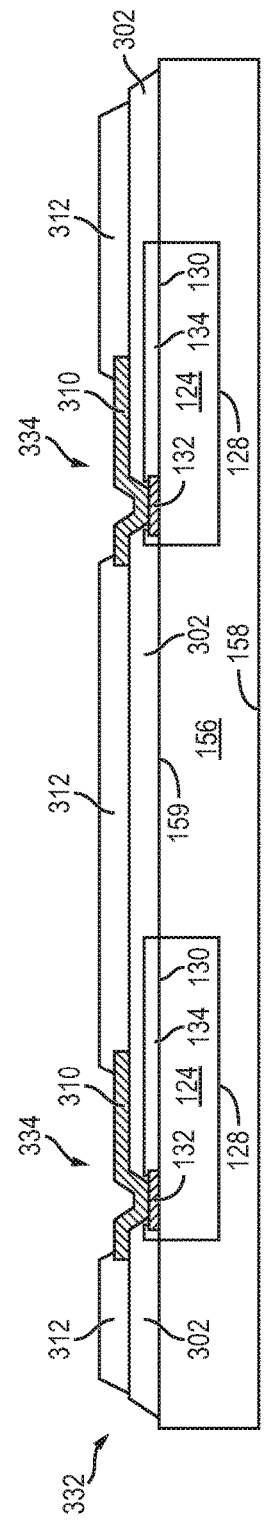
FIG. 12
FIG. 13a
FIG. 13b

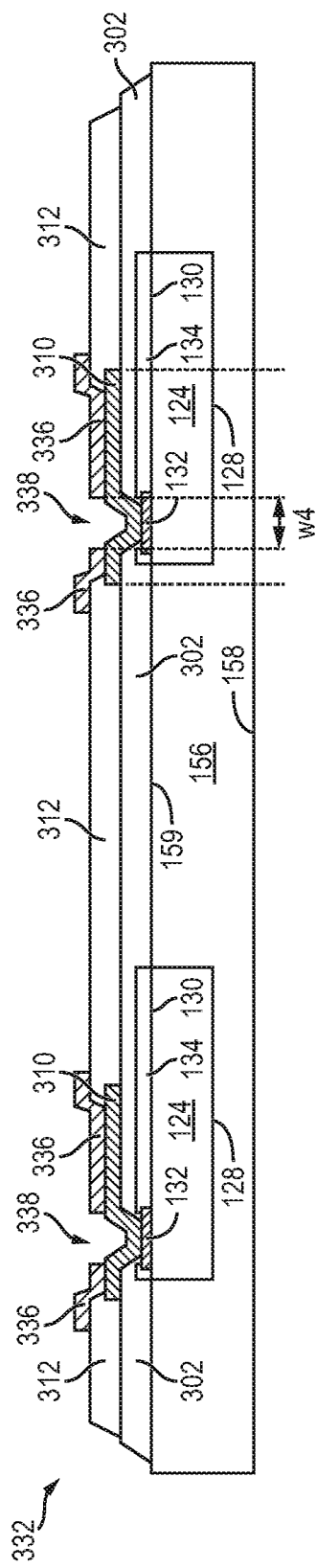
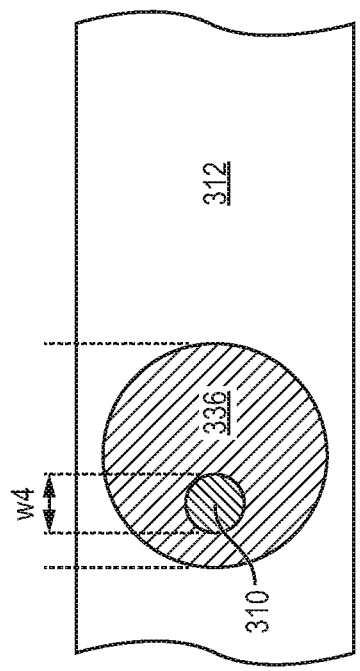
FIG. 13c
FIG. 13d

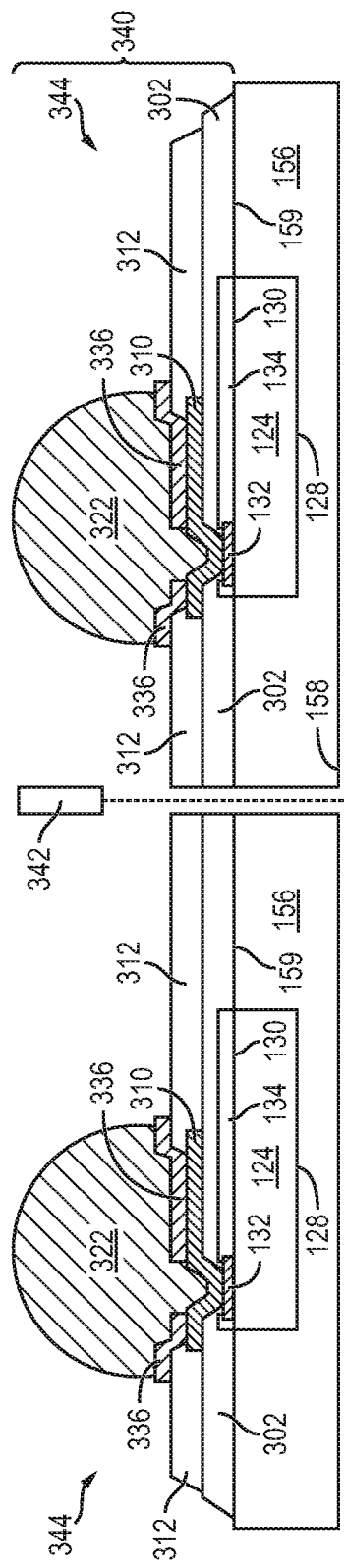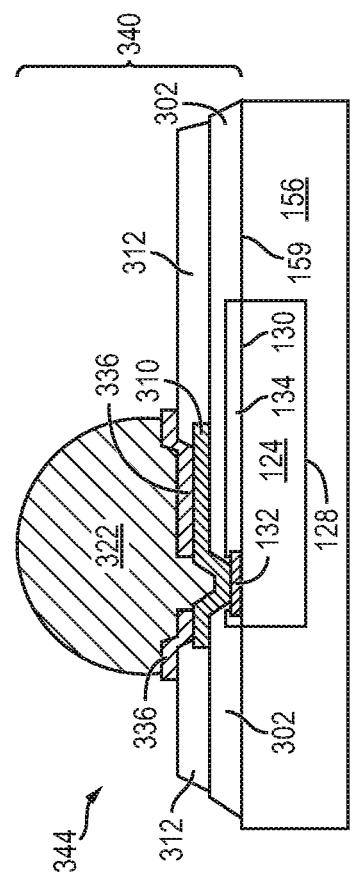

SEMICONDUCTOR DEVICE AND METHOD TO MINIMIZE STRESS ON STACK VIA

CLAIM TO DOMESTIC PRIORITY

The present application is a continuation-in-part of U.S. patent application Ser. No. 14/305,560, filed Jun. 16, 2014, which application is incorporated herein by reference.

FIELD OF THE INVENTION

The present invention relates in general to semiconductor devices and, more particularly, to a semiconductor device and method of minimizing or reducing stress in stacked vias.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

As end products, e.g., cellular phones, tablets, laptops, Personal Digital Assistants (PDAs), and camcorders, decrease in size, the frequency of accidental drops increases. Each time the end product is dropped, stress is applied to the solder joints of the semiconductor device. Drop tests and other board level reliability (BLR) tests measure a semiconductor device's ability to withstand physical and mechanical stress. In addition to testing a semiconductor device's ability to withstand physical and mechanical stress, BLR tests measure a semiconductor device's ability to withstand thermal stress, e.g., thermal stress experienced during temperature cycling due to coefficient of thermal expansion (CTE) mismatch. The thermal and mechanical stress can cause bump cracking, delamination, and other interconnect defects during manufacturing and reliability testing. Wafer level chip scale packages (WLCSP) with large semiconductor die, e.g., WLCSP greater than 7 millimeters (mm) by 7 mm, are especially susceptible to interconnect defects during temperature cycling on board (TCoB) tests. Defective devices and devices that do not meet BLR testing standards decrease production yield and increase manufacturing costs.

SUMMARY OF THE INVENTION

A need exists to reduce stress in WLCSP for improved BLR and TCoB performance. Accordingly, in one embodiment, the present invention is a method of making a semiconductor device comprising the steps of providing a semiconductor die, disposing a first insulating layer over the semiconductor die, and forming a first via in the first insulating layer over a contact pad of the semiconductor die. The method further includes the steps of disposing a first conductive layer over the first insulating layer and in the first via, disposing a second insulating layer over the first insulating layer and first conductive layer, and removing a portion of the second insulating layer to form an island of the second insulating layer over the first conductive layer and within the first via.

In another embodiment, the present invention is a method of making a semiconductor device comprising the steps of providing a semiconductor die, disposing a first insulating layer over the semiconductor die, forming a first via in the first insulating layer over a contact pad of the semiconductor die, and disposing a first conductive layer over the first insulating layer and in the first via. The method further includes the steps of disposing a second insulating layer over the first insulating layer and first conductive layer, forming a second via in the second insulating layer over the first conductive layer and the first via, disposing a second conductive layer over the first conductive layer and second conductive layer, and forming a third via in the second conductive layer and aligned with the first via.

In another embodiment, the present invention is a semiconductor device comprising a semiconductor die. A first insulating layer is disposed over the semiconductor die. A first via is formed in the first insulating layer over a contact pad of the semiconductor die. A first conductive layer is disposed over the first insulating layer and in the first via. A second insulating layer is disposed over a portion of the first insulating layer and first conductive layer. An island of the second insulating layer is formed over the first conductive layer and within the first via. The first conductive layer adjacent to the island is devoid of the second insulating layer.

In another embodiment, the present invention is a semiconductor device comprising a semiconductor die. A first insulating layer is disposed over the semiconductor die. A first via is formed in the first insulating layer over a contact pad of the semiconductor die. A first conductive layer is disposed over the first insulating layer and in the first via. A second insulating layer is disposed over the first insulating layer and first conductive layer. A second via is formed in the second insulating layer over the first conductive layer and the first via. A second conductive layer is disposed over the first conductive layer and second conductive layer. A third via is formed in the second conductive layer and aligned with the first via.

BRIEF DESCRIPTION OF THE DRAWINGS

FIGS. 2a-2d illustrate a semiconductor wafer with a plurality of semiconductor die separated by a saw street;

FIGS. 3a-3o illustrate a method of forming a dampening structure under the bumps in a fan-out WLCSP;

FIGS. 11a-11f illustrate a method of forming a compliant island in a fan-out WLCSP;

FIG. 12 illustrates the fan-out WLCSP with a compliant island formed under the bumps in accordance with FIGS. 11a-11f;

FIGS. 13a-13e illustrate a method of forming a ringed under bump metallization in a fan-out WLCSP;

FIG. 14 illustrates the fan-out WLCSP with a ringed under bump metallization formed under the bumps in accordance with FIGS. 13a-13e;

DETAILED DESCRIPTION OF THE DRAWINGS

Figure 1:
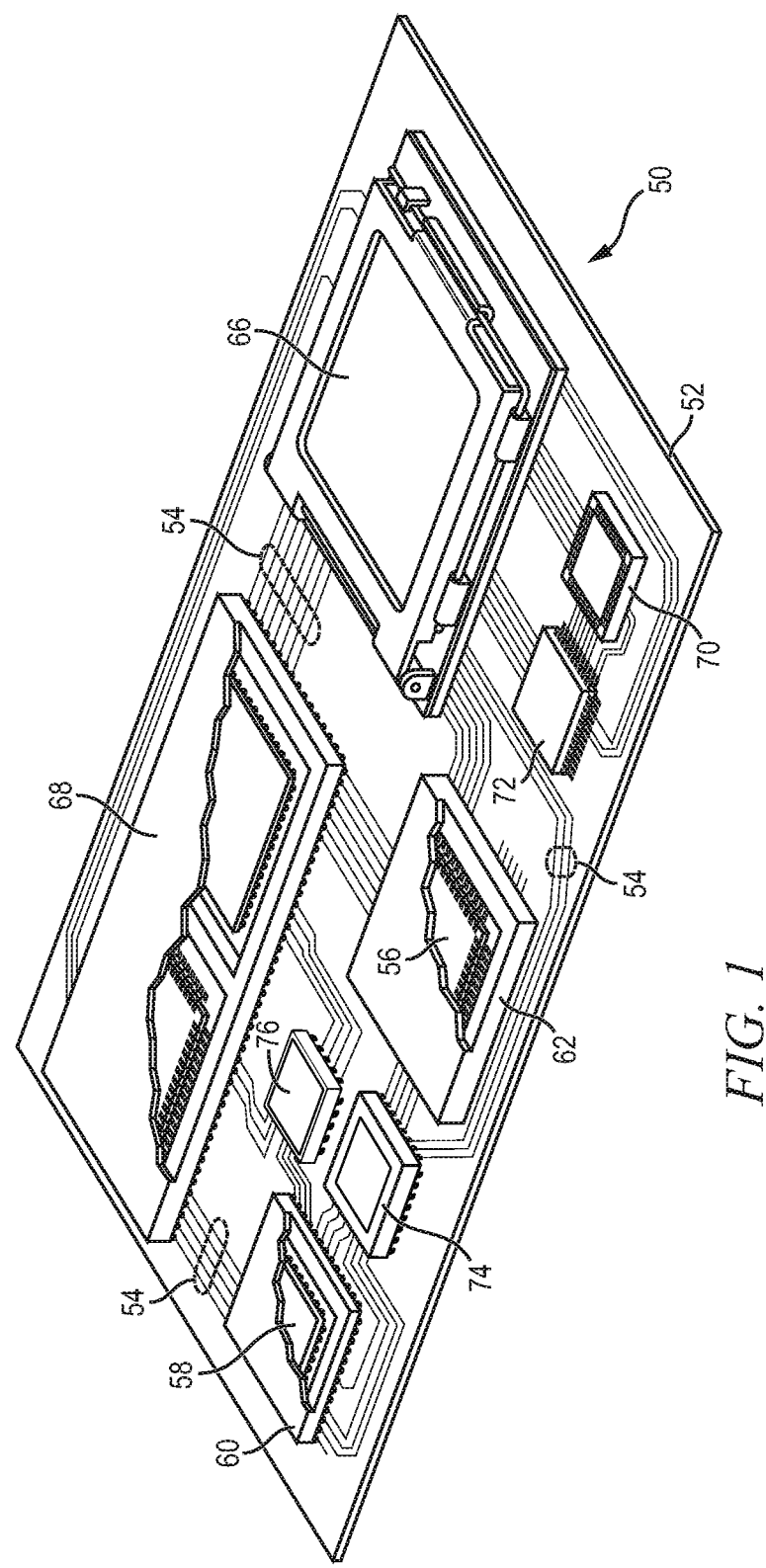
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and WLCSP 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
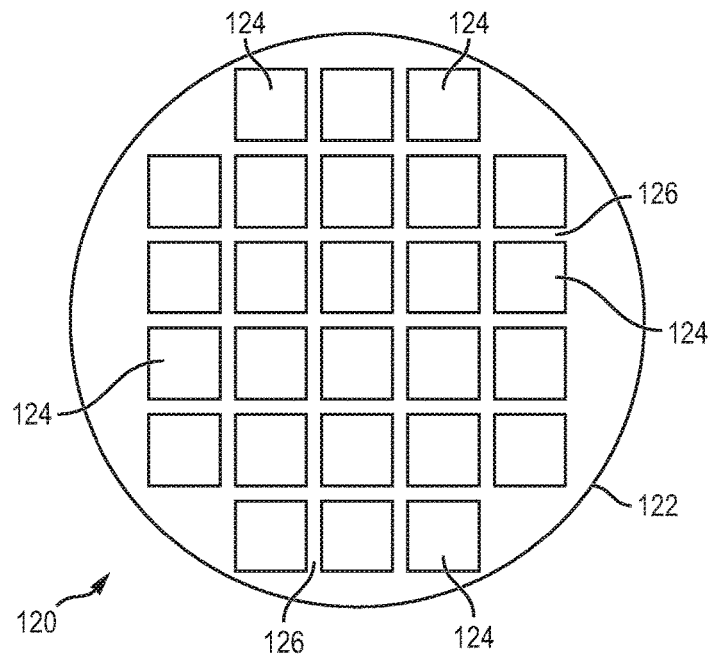

FIG. 2*a* shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 mm.

Figure 2B:
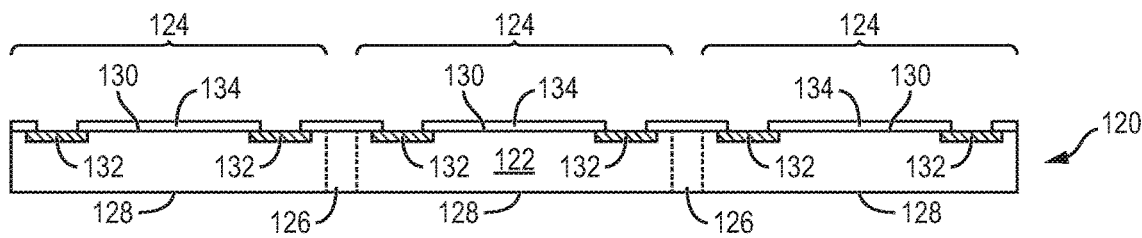

FIG. 2*b* shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2*b*. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. Insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other material having similar insulating and structural properties. A portion of insulating layer 134 is removed by an etching process through a patterned photoresist layer to expose conductive layer 132. Alternatively, a portion of insulating layer 134 is removed by laser direct ablation (LDA) to expose conductive layer 132.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
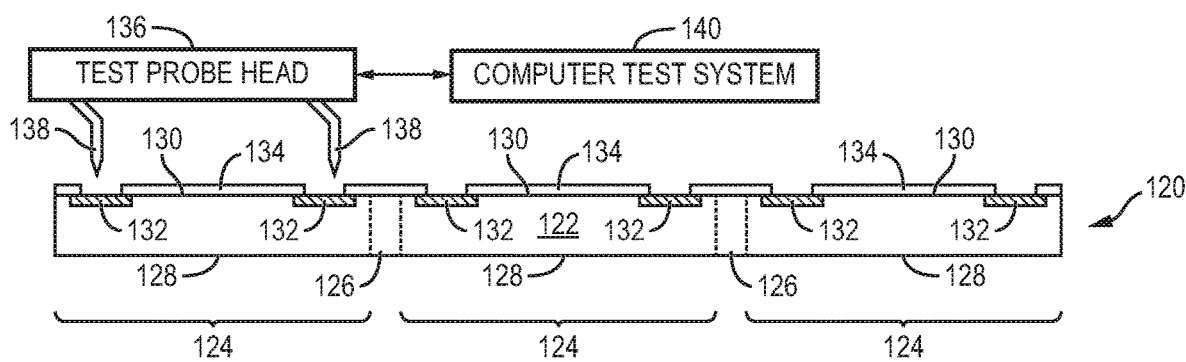

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, electrostatic discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 3O:
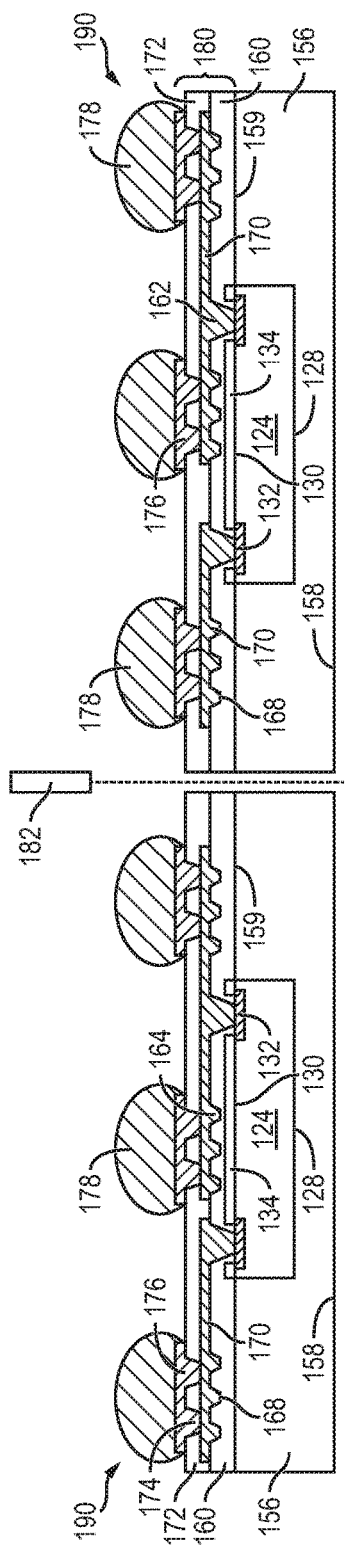

FIGS. 3a-3o illustrate, in relation to FIG. 1, a process of forming a dampening structure to improve BLR and TCoB in a fan-out WLCSP. FIG. 3a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Carrier 150 can be a round or rectangular panel (greater than 300 mm) with capacity for multiple semiconductor die 124. Carrier 150 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of semiconductor die 124 or size of semiconductor wafer 120. That is, carrier 150 has a fixed or standardized size, which can accommodate various size semiconductor die 124 singulated from one or more semiconductor wafers 120. In one embodiment, carrier 150 is circular with a diameter of 330 mm. In another embodiment, carrier 150 is rectangular with a width of 560 mm and length of 600 mm. Semiconductor die 124, which are placed on the standardized carrier 150, may have dimensions of 10 mm by 10 mm. Alternatively, semiconductor die 124, which are placed on the same standardized carrier 150, may have dimensions of 20 mm by 20 mm. Accordingly, standardized carrier 150 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 150 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Semiconductor die 124 from FIG. 2d are disposed over carrier 150 and interface layer 152 using, for example, a pick and place operation with active surface 130 and conductive layer 132 oriented toward the carrier. FIG. 3b shows semiconductor die 124 mounted to interface layer 152 of carrier 150 as reconstituted or reconfigured wafer 154.

Reconstituted wafer 154 can be processed into many types of semiconductor packages, including eWLB, fan-in WLCSP, reconstituted or embedded wafer level chip scale packages (eWLCSP), fan-out WLCSP, flipchip packages, three dimensional (3D) packages, package-on-package (PoP), or other semiconductor packages. Reconstituted wafer 154 is configured according to the specifications of the resulting semiconductor package. In one embodiment, semiconductor die 124 are placed on carrier 150 in a high-density arrangement, i.e., 300 micrometers (μm) apart or less, for processing fan-in devices. In another embodiment, semiconductor die 124 are separated by a distance of 50 μm on carrier 150. The distance between semiconductor die 124 on carrier 150 is optimized for manufacturing the semiconductor packages at the lowest unit cost. The larger surface area of carrier 150 accommodates more semiconductor die 124 and lowers manufacturing cost as more semiconductor die 124 are processed per reconstituted wafer 154. The number of semiconductor die 124 mounted to carrier 150 can be greater than the number of semiconductor die 124 singulated from semiconductor wafer 120. Reconstituted wafer 154 provides the flexibility to manufacture many different types of semiconductor packages using different size semiconductor die 124 from different sized semiconductor wafers 120.

In FIG. 3c, an encapsulant or molding compound 156 is deposited over semiconductor die 124 and carrier 150 as an insulating material using a paste printing, compressive molding, transfer molding, liquid encapsulant molding, vacuum lamination, spin coating, or other suitable applicator. In particular, encapsulant 156 covers the four side surfaces and back surface 128 of semiconductor die 124. Encapsulant 156 can be polymer composite material, such as epoxy resin with filler, epoxy acrylate with filler, or polymer with proper filler.

Encapsulant 156 is non-conductive, provides physical support, and environmentally protects the semiconductor device from external elements and contaminants. Encapsulant 156 can be deposited over semiconductor die 124 and then planarized with back surface 128 of semiconductor die 124 in a subsequent backgrinding step. The backgrinding operation removes a portion of encapsulant 156 from surface 158. In one embodiment, a portion of semiconductor die 124 is removed from back surface 128 during the backgrinding operation to further thin reconstituted wafer 154.

In FIG. 3d, carrier 150 and interface layer 152 are removed by chemical etching, mechanical peeling, chemical mechanical planarization (CMP), mechanical grinding, thermal bake, ultra violet (UV) light, laser scanning, or wet stripping to expose surface 159 of encapsulant 156 and insulating layer 134 and conductive layer 132 of semiconductor die 124.

In FIG. 3e, an insulating or passivation layer 160 is formed over semiconductor die 124 and surface 159 of encapsulant 156 using PVD, CVD, printing, lamination, spin coating, or spray coating. The insulating layer 160 contains one or more layers of SiO2, Si3N4, SiON, Ta2O5, Al2O3, or other material having similar insulating and structural properties. A portion of insulating layer 160 is removed by an exposure or development process, LDA, etching, or other suitable process to form openings or vias 162 over conductive layer 132. Openings 162 extend completely through insulating layer 160 and expose a surface of conductive layer 132.

Another portion of insulating layer 160 is removed by an exposure or development process, LDA using laser 166, etching, or other suitable process to form a plurality of grooves or micro vias 164. The depth of grooves 164 is less than the thickness of insulating layer 160. A portion of insulating layer 160 remains between a bottom surface 168 of grooves 164 and surface 159 of encapsulant 156, and between bottom surface 168 and insulating layer 134. Grooves 164 do not expose encapsulant 156 or insulating layer 134.

In FIG. 3f, an electrically conductive layer 170 is formed over insulating layer 160 and within openings 162 and grooves 164 using a deposition process such as sputtering, electrolytic plating, or electroless plating. Conductive layer 170 can be one or more layers of Al, Cu, Sn, Ni, Au, Ag, or other suitable electrically conductive material. Conductive layer 170 operates as a redistribution layer (RDL) formed over semiconductor die 124. RDL 170 provides a conductive path extending from conductive layer 132 to other areas above semiconductor die 124 and encapsulant 156 for bump formation and external interconnect. One portion of conductive layer 170 is electrically connected to conductive layer 132. Other portions of conductive layer 170 can be electrically common or electrically isolated depending on the design and function of semiconductor die 124.

Conductive layer 170 is disposed in grooves 164 around portions of insulating layer 160 to create a dampening structure in insulating layer 160. The location of the dampening structures, i.e., grooves 164, is selected to correspond to bump formation. Conductive layer 170 is thicker in the area where conductive layer 170 fills grooves 164. The increased thickness of conductive layer 170 increases reliability of the semiconductor package. Grooves 164 also increase a size or area of the contact surface between conductive layer 170 and insulating layer 160 resulting in better bonding strength. The dampening structure reduces defects caused by physical and mechanical stress. The dampening structure formed in insulating layer 160 also reduces thermal stress, for example, stress caused by CTE mismatch, by redistributing and dissipating the cycling energy to improve TCoB.

FIG. 3g shows a plan view of conductive layer 170 disposed in grooves 164 to form a dampening structure with a honeycomb pattern. In FIG. 3g, grooves 164 form a honeycomb pattern in insulating layer 160 with portions of insulating layer 160 having a hexagonal cross section formed between the grooves. Conductive layer 170 is deposited into grooves 164 around the hexagonal portions of insulating layer 160. Grooves 164 can have a straight, sloped, stepped, or tapered sidewall. While grooves 164 are illustrated forming a honeycomb pattern with hexagonal shaped portions of insulating layer 160 remaining between the grooves, grooves 164 can form any shape or pattern in insulating layer 160. For example, grooves 164 can leave portions of insulating layer 160 having a cross section with a circular or oval shape, octagonal shape, star shape, cross shape, lattice shape, or any other geometric shape.

FIG. 3h illustrates another embodiment of conductive layer 170 disposed in grooves 164 to form a dampening structure with a ring pattern. In FIG. 3h, grooves 164 are formed in a concentric ring pattern around a central cylindrical portion of insulating layer 160. Conductive layer 170 is deposited in grooves 164 to form a plurality of conductive rings. A ring of insulating layer 160 separates each conductive ring 170. Grooves 164 can have a straight, sloped, stepped, or tapered sidewall. Conductive rings 170 can vary in shape and size. For example, in one embodiment, a width of the center or inner most conductive ring 170 is greater than a width of an adjacent outer conductive ring 170. While grooves 164 are illustrated forming a concentric ring pattern in insulating layer 160, grooves 164 can form any shape or pattern in insulating layer 160. For example, grooves 164 can leave portions of insulating layer 160 having a cross section with a circular or oval shape, octagonal shape, star shape, cross shape, lattice shape, or any other geometric shape.

FIG. 3i illustrates another embodiment of conductive layer 170 disposed in grooves 164 to form a dampening structure with a circular pattern. Grooves 164 are formed in insulating layer 160 with portions of insulating layer 160 having a circular cross section formed between the grooves. Conductive layer 170 is deposited into grooves 164 around the circular portions of insulating layer 160. Grooves 164 can have a straight, sloped, stepped, or tapered sidewall, and any number of grooves, i.e., circular portions of insulating layer 160, may be formed. While grooves 164 are illustrated forming a circular pattern with portions of insulating layer 160 having a circular cross section remaining between the grooves, grooves 164 can form any shape or pattern. For example, grooves 164 can leave portions of insulating layer 160 having a cross section with an oval shape, octagonal shape, star shape, cross shape, lattice shape, or any other geometric shape.

In FIG. 3j, an insulating or passivation layer 172 is formed over insulating layer 160 and conductive layer 170 using PVD, CVD, printing, lamination, spin coating, or spray coating. The insulating layer 172 contains one or more layers of SiO2, Si3N4, SiON, Ta2O5, Al2O3, or other material having similar insulating and structural properties. A portion of insulating layer 172 is removed by an exposure or development process, LDA, etching, or other suitable process to form a plurality of grooves or vias 174. The depth of grooves 174 is equal to the thickness of insulating layer 172 over conductive layer 170. Grooves 174 expose conductive layer 170.

In FIG. 3k, an electrically conductive layer 176 is formed over insulating layer 172 and within grooves 174 using a deposition process such as sputtering, electrolytic plating, or electroless plating. Conductive layer 176 can be one or more layers of Al, Cu, Sn, Ni, Au, Ag, or other suitable electrically conductive material. Conductive layer 176 is electrically connected to conductive layer 170. In one embodiment, conductive layer 176 is a multi-layer stack under bump metallization (UBM) layer including an adhesion layer, barrier layer, and seed or wetting layer. The adhesion layer is formed over conductive layer 170 and can be Ti, titanium nitride (TiN), titanium tungsten (TiW), Al, or chromium (Cr). The barrier layer is formed over the adhesion layer and can be Ni, NiV, platinum (Pt), palladium (Pd), TiW, or chromium copper (CrCu). The barrier layer inhibits the diffusion of Cu. The seed layer is formed over the barrier layer and can be Cu, Ni, NiV, Au, or Al. UBM 176 provides a low resistive interconnect to conductive layer 170, as well as a barrier to solder diffusion and a seed layer for solder wettability.

Conductive layer 176 is disposed in grooves 174 around portions of insulating layer 172 to create a dampening structure in insulating layer 172. The location of the dampening structures, i.e., grooves 174, is selected to correspond to the location of bump formation. Grooves 174 increase the size or area of the contact surface between conductive layer 176 and insulating layer 172 resulting in increased bonding strength. The dampening structure reduces defects caused by physical and mechanical stress. The dampening structure formed in insulating layer 172 also reduces thermal stress, for example, stress caused by CTE mismatch, by redistributing and dissipating the cycling energy and to improve TCoB.

FIG. 3*l* shows a plan view of conductive layer 176 disposed in grooves 174 to form a dampening structure with a honeycomb pattern. In FIG. 3*l*, grooves 174 form a honeycomb pattern in insulating layer 172 with portions of insulating layer 172 having a hexagonal cross section formed between the grooves. Conductive layer 176 is deposited into grooves 174 around the hexagonal portions of insulating layer 172. Grooves 174 can have a straight, sloped, stepped, or tapered sidewall. While grooves 174 are illustrated forming a honeycomb pattern with hexagonal shaped portions of insulating layer 172 remaining between the grooves, grooves 174 can form any shape or pattern in insulating layer 172. For example, grooves 174 can leave portions of insulating layer 172 having a cross section with a circular or oval shape, octagonal shape, star shape, cross shape, lattice shape, or any other geometric shape.

FIG. 3*m* illustrates another embodiment of conductive layer 176 disposed in grooves 174 to form a dampening structure with a ring pattern. In FIG. 3*m*, grooves 174 are formed in insulating layer 172 in a concentric ring pattern around a central cylindrical portion of insulating layer 172. Conductive layer 176 is deposited in grooves 174 to form a plurality of conductive rings. A ring of insulating layer 172 separates each conductive ring 176. Grooves 174 can have a straight, sloped, stepped, or tapered sidewall. Conductive rings 176 can vary in shape and size. For example, in one embodiment, a width of the center or inner most conductive ring 176 is greater than a width of an adjacent outer conductive ring 176. While grooves 174 are illustrated forming a concentric ring pattern in insulating layer 172, grooves 174 can form any shape or pattern in insulating layer 172. For example, grooves 174 can leave portions of insulating layer 172 having a cross section with a circular or oval shape, octagonal shape, star shape, cross shape, lattice shape, or any other geometric shape.

FIG. 3*n* illustrates another embodiment of conductive layer 176 disposed in grooves 174 to form a dampening structure with a circular pattern. Grooves 174 are formed in insulating layer 172 with portions of insulating layer 172 having a circular cross section formed between the grooves. Conductive layer 176 is deposited into grooves 174 around the circular portions of insulating layer 172. Grooves 174 can have a straight, sloped, stepped, or tapered sidewall, and any number of grooves, i.e., circular portions of insulating layer 172, may be formed. While grooves 174 are illustrated forming a circular pattern with portions of insulating layer 172 having a circular cross section remaining between the grooves, grooves 174 can form any shape or pattern. For example, grooves 174 can leave portions of insulating layer 172 having a cross section with an oval shape, octagonal shape, star shape, cross shape, lattice shape, or any other geometric shape.

In FIG. 3*o*, an electrically conductive bump material is deposited over conductive layer 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above the material's melting point to form balls or bumps 178. In some applications, bumps 178 are reflowed a second time to improve electrical contact to conductive layer 176. Bumps 178 can also be compression bonded or thermocompression bonded to conductive layer 176. Bumps 178 represent one type of interconnect structure that can be formed over conductive layer 176. The interconnect structure can also use stud bump, micro bump, or other electrical interconnect.

Taken together, insulating layers 160 and 172, conductive layers 170 and 176, and conductive bumps 178 form a build-up interconnect structure 180. The number of insulating and conductive layers included within interconnect structure 180 depends on, and varies with, the complexity of the circuit routing design. Accordingly, interconnect structure 180 can include any number of insulating and conductive layers to facilitate electrical interconnect with respect to semiconductor die 124. A dampening structure, i.e., grooves, may be formed in any or all of the insulating layers in build-up interconnect structure 180.

Figure 4:
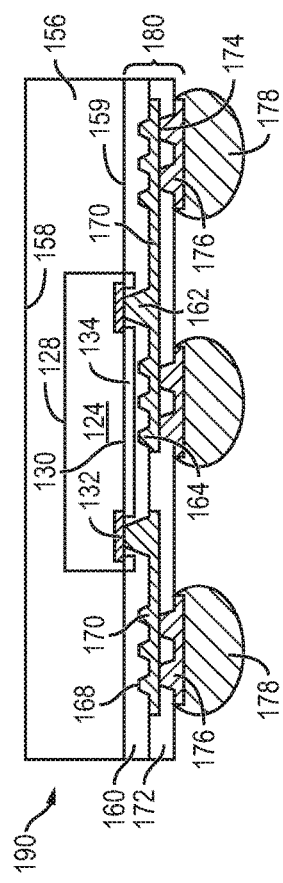
FIG. 4 illustrates the fan-out WLCSP with a dampening structure formed under the bumps in accordance with FIGS. 3a-3o.

Reconstituted wafer 154 is singulated through encapsulant 156 and build-up interconnect structure 180 using a saw blade or laser cutting tool 182 into individual fan-out WLCSP 190. FIG. 4 shows fan-out WLCSP 190 after singulation. Semiconductor die 124 is electrically connected through conductive layers 170 and 176 to bumps 178 for external interconnect. Conductive layer 170 is disposed in grooves 164 around portions of insulating layer 160. Conductive layer 176 is disposed in grooves 174 around portions of insulating layer 172. The portions of conductive layers 170 and 176 disposed in grooves 164 and grooves 174 create a dampening structure in build-up interconnect structure 180 under a footprint of bumps 178. The dampening structure reduces vibration caused by physical and mechanical stress. Grooves 164 allow conductive layer 170 to be thicker under bumps 178. The increased thickness of conductive layer 170 increases package reliability. Grooves 164 increase the size or area of the contact surface between conductive layer 170 and insulating layer 160. The increased contact surface increases bonding strength between conductive layer 170 and insulating layer 160. The portions of conductive layer 170 disposed in grooves 164 secure conductive layer 170 in place and prevent conductive layer 170 from shifting horizontally, i.e., along a plane parallel to surface 128 of semiconductor die 124. Grooves 174 increase the size or area of the contact surface between conductive layer 176 and insulating layer 172. The increased contact surface increases bonding strength between conductive layer 176 and insulating layer 172 resulting in improved package reliability. The portions of conductive layer 176 disposed in grooves 174 secure conductive layer 176 in place and prevent conductive layer 176 from shifting horizontally, i.e., along a plane parallel to surface 128 of semiconductor die 124. Accordingly, an increased amount of force or physical stress is needed to displace conductive layers 170 and 176, and defects in fan-out WLCSP 190 from physical and mechanical stress are reduced.

The dampening structure also reduces thermal stress, for example, stress caused by CTE mismatch. Disposing conductive layers 170 and 176 in grooves 164 and 174 around portions of insulating layers 160 and 172, respectively, redistributes and dissipates the cycling energy and improves TCoB. Grooves 164 and 174 are disposed below bumps 178 to redistribute and reduce the thermal and mechanical stress on bumps 178 and conductive layers 170 and 176. The stress relief is particularly useful for large die WLCSP, e.g., WLCSP greater than or equal to 7 mm by 7 mm. Grooves 164 and 174 decrease bump cracking, delamination, and other interconnect defects in fan-out WLCSP 190. The reduction of stress in fan-out WLCSP 190 increases package performance and pass rates for packages undergoing TCoB and other BLR tests. The increased package quality and pass rates increase production yield, which lowers overall manufacturing costs.

Figure 5:
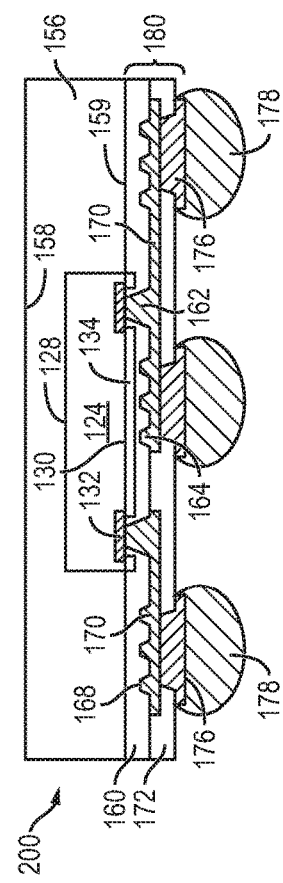
FIG. 5 illustrates another fan-out WLCSP with a dampening structure formed under the bumps.

FIG. 5 shows an embodiment of fan-out WLCSP 200, similar to FIGS. 3a-3o, with grooves 164 forming a dampening structure in insulating layer 160 under a footprint of bumps 178, and no groove pattern formed in insulating layer 172. Encapsulant 156 is formed over semiconductor die 124. Insulating layer 160 is formed over encapsulant 156 and semiconductor die 124. A portion of insulating layer 160 is removed to form openings 162 exposing conductive layer 132 of semiconductor die 124. Another portion of insulating layer 160 is removed to form grooves 164. Conductive layer 170 is formed over insulating layer 160 and within grooves 164. Conductive layer 170 disposed in grooves 164 around portions of insulating layer 160 creates a dampening structure in insulating layer 160. The location of the dampening structures is selected to correspond to the locations of bumps 178. Grooves 164 can be patterned to form a dampening structure having a honeycomb, ring, circular, or other shape pattern, similar to FIGS. 3g-3i. Conductive layer 170 is thicker in the area where conductive layer 170 fills grooves 164. Insulating layer 172 is formed over insulating layer 160 and conductive layer 170. A portion of insulating layer 172 is removed to expose conductive layer 170. Conductive layer 176 is formed over insulating layer 172 and the exposed portion of conductive layer 170. In one embodiment, conductive layer 176 is a UBM layer including an adhesion layer, barrier layer, and seed or wetting layer. Bumps 178 are formed over conductive layer 176. Insulating layers 160 and 172, conductive layers 170 and 176, and conductive bumps 178 form a build-up interconnect structure 180. The number of insulating and conductive layers included within interconnect structure 180 depends on, and varies with, the complexity of the circuit routing design. Interconnect structure 180 can include any number of insulating and conductive layers to facilitate electrical interconnect with respect to semiconductor die 124. A dampening structure, i.e., grooves, may be formed in any or all of the insulating layers in build-up interconnect structure 180.

Semiconductor die 124 is electrically connected through conductive layers 170 and 176 to bumps 178 for external interconnect. Conductive layer 170 is disposed in grooves 164 around portions of insulating layer 160. The portions of conductive layer 170 disposed in grooves 164 create a dampening structure in build-up interconnect structure 180 under bumps 178. The dampening structure reduces vibration caused by physical and mechanical stress. Grooves 164 allow conductive layer 170 to be thicker under bumps 178. The increased thickness of conductive layer 170 increases package reliability. Grooves 164 increase the size or area of the contact surface between conductive layer 170 and insulating layer 160. The increased contact surface increases bonding strength between conductive layer 170 and insulating layer 160. The portions of conductive layer 170 disposed in grooves 164 secure conductive layer 170 in place and prevent conductive layer 170 from shifting horizontally, i.e., along a plane parallel to surface 128 of semiconductor die 124. Accordingly, an increased amount of force or physical stress is needed to displace conductive layer 170, and defects in fan-out WLCSP 200 from physical and mechanical stress are reduced.

The dampening structure also reduces thermal stress, for example, stress caused by CTE mismatch. Disposing conductive layers 170 in grooves 164 around portions of insulating layers 160 redistributes and dissipates the cycling energy and improves TCoB. Grooves 164 are disposed below bumps 178 to redistribute and reduce the thermal and mechanical stress on bumps 178 and conductive layers 170 and 176. The stress relief is particularly useful for large die WLCSP, e.g., WLCSP greater than or equal to 7 mm by 7 mm. Grooves 164 decrease bump cracking, delamination, and other interconnect defects in fan-out WLCSP 200. The reduction of stress in fan-out WLCSP 200 increases package performance and pass rates for packages undergoing TCoB and other BLR tests. The increased package quality and pass rates increases production yield, which lowers overall manufacturing costs.

Figure 6:
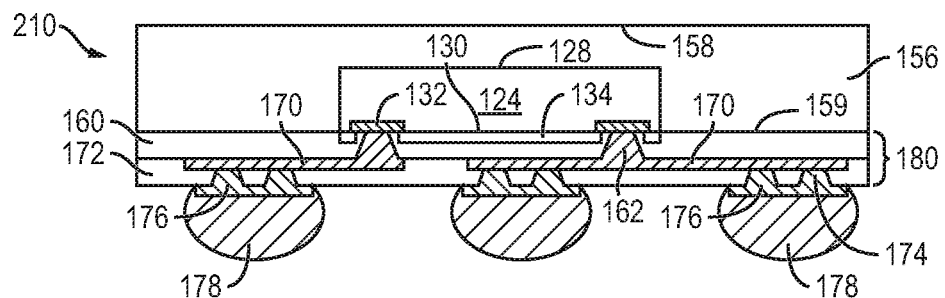
FIG. 6 illustrates another fan-out WLCSP with a dampening structure formed under the bumps.

FIG. 6 shows an embodiment of fan-out WLCSP 210, similar to FIGS. 3a-3o, with grooves 174 forming a dampening structure in insulating layer 172 under bumps 178, and no groove pattern formed in insulating layer 160. Encapsulant 156 is formed over semiconductor die 124. Insulating layer 160 is formed over encapsulant 156 and semiconductor die 124. A portion of insulating layer 160 is removed to form openings 162 exposing conductive layer 132 of semiconductor die 124. Conductive layer 170 is formed over insulating layer 160 and exposed conductive layer 132. Insulating layer 172 is formed over insulating layer 160 and conductive layer 170. A portion of insulating layer 172 is removed to form grooves 174 and expose conductive layer 170. Conductive layer 176 is formed over insulating layer 172 and within grooves 174. In one embodiment, conductive layer 176 is a UBM layer including an adhesion layer, barrier layer, and seed or wetting layer. Bumps 178 are formed over conductive layer 176. Conductive layer 176 disposed in grooves 174 around portions of insulating layer 172 creates a dampening structure in insulating layer 172. The location of the dampening structures is selected to correspond to the location of bumps 178. Grooves 174 can be patterned to form a dampening structure having a honeycomb, ring, circular, or other shape pattern, similar to FIGS. 3l-3n. Insulating layers 160 and 172, conductive layers 170 and 176, and conductive bumps 178 form a build-up interconnect structure 180. The number of insulating and conductive layers included within interconnect structure 180 depends on, and varies with, the complexity of the circuit routing design. Interconnect structure 180 can include any number of insulating and conductive layers to facilitate electrical interconnect with respect to semiconductor die 124. A dampening structure, i.e., grooves, may be formed in any or all of the insulating layers in build-up interconnect structure 180.

Semiconductor die 124 is electrically connected through conductive layers 170 and 176 to bumps 178 for external interconnect. Conductive layer 176 is disposed in grooves 174 around portions of insulating layer 172. The portions of conductive layer 176 disposed in grooves 174 create a dampening structure in build-up interconnect structure 180 under bumps 178. The dampening structure reduces vibration caused by physical and mechanical stress. Grooves 174 increase the size or area of the contact surface between conductive layer 176 and insulating layer 172. The increased contact surface increases bonding strength between conductive layer 176 and insulating layer 172 resulting in improved package reliability. The portions of conductive layer 176 disposed in grooves 174 secure conductive layer 176 in place and prevent conductive layer 176 from shifting horizontally, i.e., along a plane parallel to surface 128 of semiconductor die 124. Accordingly, an increased amount of force or physical stress is needed to displace conductive layer 176, and defects in fan-out WLCSP 210 from physical and mechanical stress are reduced.

The dampening structure also reduces thermal stress, for example, stress caused by CTE mismatch. Disposing conductive layer 176 in grooves 174 around portions of insulating layers 172 redistributes and dissipates the cycling energy and improves TCoB. Grooves 174 are disposed below bumps 178 to redistribute and reduce the thermal and mechanical stress on bumps 178 and conductive layers 170 and 176. The stress relief is particularly useful for large die WLCSP, e.g., WLCSP greater than or equal to 7 mm by 7 mm. Grooves 174 decrease bump cracking, delamination, and other interconnect defects in fan-out WLCSP 210. The reduction of stress in fan-out WLCSP 210 increases package performance and pass rates for packages undergoing TCoB and other BLR tests. The increased package quality and pass rates increases production yield, which lowers overall manufacturing costs.

Figure 7:
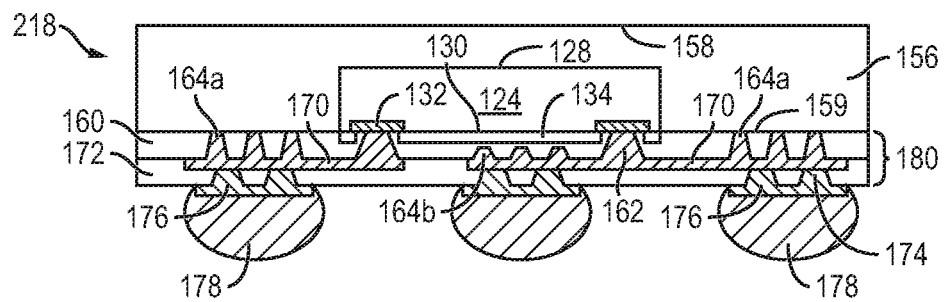
FIG. 7 illustrates another fan-out WLCSP with a dampening structure formed under the bumps.

FIG. 7 shows an embodiment of fan-out WLCSP 218, similar to FIGS. 3*a*-3*o*, with grooves 164*a* extending to surface 159 of encapsulant 156. Encapsulant 156 is formed over semiconductor die 124. Insulating layer 160 is formed over encapsulant 156 and semiconductor die 124. A portion of insulating layer 160 is removed to form openings 162 exposing conductive layer 132 of semiconductor die 124. Another portion of insulating layer 160 is removed to form grooves 164. Grooves 164*a* are formed over encapsulant 156 in a peripheral region of semiconductor die 124. Grooves 164*b* are formed over semiconductor die 124. Grooves 164*a* have a depth equal to the thickness of insulating layer 160 and extend to surface 159 of encapsulant 156. Grooves 164*a* expose encapsulant 156. Grooves 164*b* have a depth less than the thickness of insulating layer 160. A portion of insulating layer 160 remains between the bottom surfaces of grooves 164*b* and insulating layer 134 of semiconductor die 124. Grooves 164*b* do not expose insulating layer 134. Conductive layer 170 is formed over insulating layer 160 and within grooves 164*a* and 164*b*. Conductive layer 170 disposed in grooves 164*a* and 164*b* around portions of insulating layer 160 creates a dampening structure in insulating layer 160. The location of the dampening structures is selected to correspond to the location of bumps 178. Grooves 164*a* and 164*b* can be patterned to form a dampening structure having a honeycomb, ring, circular, or other shape pattern, similar to FIGS. 3*g*-3*i*. Conductive layer 170 is thicker in the area where conductive layer 170 fills grooves 164*a* and 164*b*.

Insulating layer 172 is formed over insulating layer 160 and conductive layer 170. A portion of insulating layer 172 is removed to form grooves 174 exposing conductive layer 170. Conductive layer 176 is formed over insulating layer 172 and within grooves 174. In one embodiment, conductive layer 176 is a UBM layer including an adhesion layer, barrier layer, and seed or wetting layer. Conductive layer 176 disposed in grooves 174 around portions of insulating layer 172 creates a dampening structure in insulating layer 172. The location of the dampening structures is selected to correspond to the locations of bumps 178. Grooves 174 can be patterned to form a dampening structure having a honeycomb, ring, circular, or other shape pattern, similar to FIGS. 3*l*-3*n*. Bumps 178 are formed over conductive layer 176. Insulating layers 160 and 172, conductive layers 170 and 176, and conductive bumps 178 form a build-up interconnect structure 180. The number of insulating and conductive layers included within interconnect structure 180 depends on, and varies with, the complexity of the circuit routing design. Interconnect structure 180 can include any number of insulating and conductive layers to facilitate electrical interconnect with respect to semiconductor die 124. A dampening structure, i.e., grooves, may be formed in any or all of the insulating layers in build-up interconnect structure 180.

Semiconductor die 124 is electrically connected through conductive layers 170 and 176 to bumps 178 for external interconnect. Conductive layer 170 is disposed in grooves 164*a* and 164*b* around portions of insulating layer 160. Conductive layer 176 is disposed in grooves 174 around portions of insulating layer 172. The portions of conductive layers 170 and 176 disposed in grooves 164*a*-164*b* and grooves 174 create a dampening structure in build-up interconnect structure 180 under bumps 178. The dampening structure reduces vibration caused by physical and mechanical stress. Grooves 164*a* and 164*b* allow conductive layer 170 to be thicker under bumps 178. The increased thickness of conductive layer 170 increases package reliability. Grooves 164*a* and 164*b* increase the size or area of the contact surface between conductive layer 170 and insulating layer 160. The increased contact surface increases bonding strength between conductive layer 170 and insulating layer 160. The portions of conductive layer 170 disposed in grooves 164*a* and 164*b* secure conductive layer 170 in place and prevent conductive layer 170 from shifting horizontally, i.e., along a plane parallel to surface 128 of semiconductor die 124. Grooves 174 increase the size or area of the contact surface between conductive layer 176 and insulating layer 172. The increased contact surface increases bonding strength between conductive layer 176 and insulating layer 172, which results in greater package reliability. The portions of conductive layer 176 disposed in grooves 174 secure conductive layer 176 in place and prevent conductive layer 176 from shifting horizontally, i.e., along a plane parallel to surface 128 of semiconductor die 124. Accordingly, an increased amount of force or physical stress is needed to displace conductive layers 170 and 176, and defects in fan-out WLCSP 218 caused by physical and mechanical stress are reduced.

The dampening structure also reduces thermal stress, for example, stress caused by CTE mismatch. Disposing conductive layers 170 and 176 in grooves 164*a*-164*b* and 174 around portions of insulating layers 160 and 172, respectively, redistributes and dissipates the cycling energy and improves TCoB. Grooves 164*a*-164*b* and 174 are disposed below bumps 178 to redistribute and reduce the thermal and mechanical stress on bumps 178 and conductive layers 170 and 176. The stress relief is particularly useful for large die WLCSP, e.g., WLCSP greater than or equal to 7 mm by 7 mm. Grooves 164*a*-164*b* and 174 decrease bump cracking, delamination, and other interconnect defects in fan-out WLCSP 218. The reduction of stress in fan-out WLCSP 218 increases package performance and pass rates for packages undergoing TCoB and other BLR tests. The increased package quality and pass rates increases production yield, which lowers manufacturing costs.

Figure 8A:
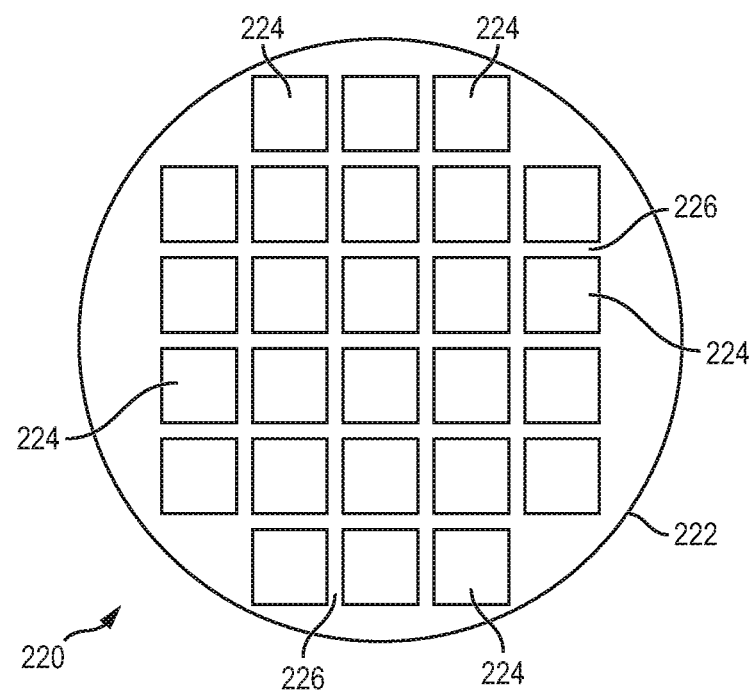
FIGS. 8a-8e illustrate a method of forming a dampening structure in a fan-in WLCSP.

FIGS. 8*a*-8*e* illustrate, in relation to FIG. 1, a process of forming a dampening structure under the bumps of a fan-in WLCSP. FIG. 8*a* shows a semiconductor wafer 220 with a base substrate material 222, such as silicon, germanium, aluminum phosphide, aluminum arsenide, gallium arsenide, gallium nitride, indium phosphide, silicon carbide, or other bulk semiconductor material for structural support. A plurality of semiconductor die or components 224 is formed on wafer 220. In one embodiment, wafer 220 is a reconstituted wafer formed by placing a plurality of singulated semiconductor die 224 on a carrier in a high-density arrangement (i.e., 300 μm apart or less), encapsulating the die, and removing the carrier. Semiconductor die 224 are separated saw street 226. Saw street 226 is a non-active, inter-die wafer or encapsulant area, as described above. Saw street 226 provides cutting areas to singulate semiconductor wafer 220 into individual semiconductor die 224. In one embodiment, semiconductor wafer 220 has a width or diameter of 100-450 mm.

Figure 8B:
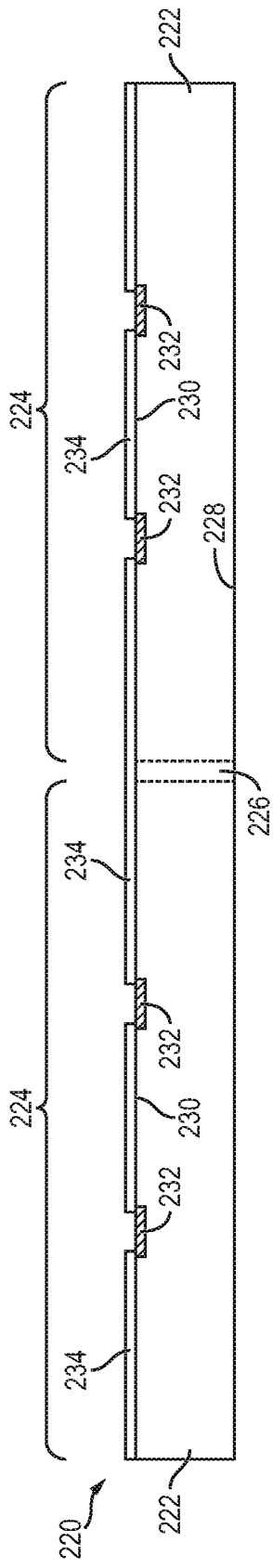

FIG. 8*b* shows a cross-sectional view of a portion of semiconductor wafer 220. Each semiconductor die 224 has a back or non-active surface 228 and an active surface 230 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as DSP, ASIC, memory, or other signal processing circuit. Semiconductor die 224 may also contain IPDs, such as inductors, capacitors, and resistors, for RF signal processing.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230. Conductive layer 232 can be formed as contact pads disposed side-by-side a first distance from the edge of semiconductor die 224, as shown in FIG. 8*b*. Alternatively, conductive layer 232 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 234 is formed over active surface 230 and conductive layer 232 using PVD, CVD, printing, spin coating, spray coating, sintering or thermal oxidation. Insulating layer 234 contains one or more layers of SiO2, Si3N4, SiON, Ta2O5, Al2O3, HfO2, BCB, PI, PBO, or other material having similar insulating and structural properties. A portion of insulating layer 234 is removed by an etching or LDA to expose conductive layer 232.

Figure 8C:
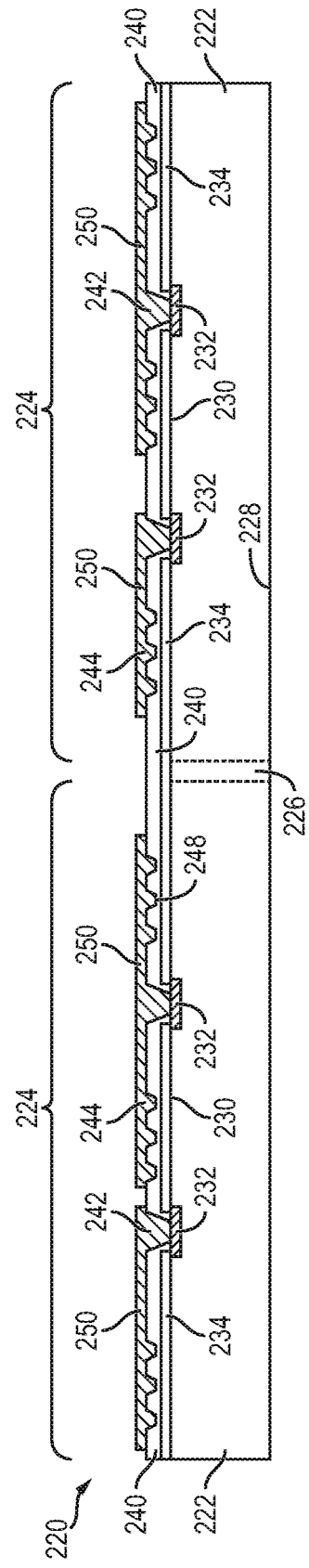

In FIG. 8*c*, an insulating or passivation layer 240 is formed over insulating layer 234 and conductive layer 232 using PVD, CVD, printing, lamination, spin coating, or spray coating. Insulating layer 240 contains one or more layers of SiO2, Si3N4, SiON, Ta2O5, Al2O3, or other material having similar insulating and structural properties. A portion of insulating layer 240 is removed by an exposure or development process, LDA, etching, or other suitable process to form openings or vias 242 over conductive layer 232. Openings 242 extend completely through insulating layer 240 and expose a surface of conductive layer 232.

Another portion of insulating layer 240 is removed by an exposure or development process, LDA, etching, or other suitable process to form a plurality of grooves or micro vias 244. The depth of grooves 244 is less than the thickness of insulating layer 240. A portion of insulating layer 240 remains between a bottom surface 248 of grooves 244 and insulating layer 234. Grooves 244 do not expose insulating layer 234.

An electrically conductive layer 250 is formed over insulating layer 240 and within openings 242 and grooves 244 using a deposition process such as sputtering, electrolytic plating, or electroless plating. Conductive layer 250 can be one or more layers of Al, Cu, Sn, Ni, Au, Ag, or other suitable electrically conductive material. Conductive layer 250 operates as an RDL formed over semiconductor die 224. RDL 250 provides a conductive path extending from conductive layer 232 to other areas above semiconductor die 224 for bump formation and external interconnect. One portion of conductive layer 250 is electrically connected to conductive layer 232. Other portions of conductive layer 250 can be electrically common or electrically isolated depending on the design and function of semiconductor die 224.

Conductive layer 250 is disposed in grooves 244 around portions of insulating layer 240 to create a dampening structure in insulating layer 240. The location of the dampening structures, i.e., grooves 244, is selected to correspond to the location of bump formation. Grooves 244 can be patterned to form a dampening structure having a honeycomb, ring, circular, or other shape pattern, similar to FIGS. 3*g*-3*i*. Conductive layer 250 is thicker in the area where conductive layer 250 fills grooves 244. The increased thickness of conductive layer 250 increases reliability of the semiconductor package. Grooves 244 also increase the size or area of the contact surface between conductive layer 250 and insulating layer 240 resulting in better bonding strength. The dampening structure reduces defects caused by physical and mechanical stress. The dampening structure formed in insulating layer 240 also reduces thermal stress, for example, stress caused by CTE mismatch, by redistributing and dissipating the cycling energy and to improve TCoB.

Figure 8D:
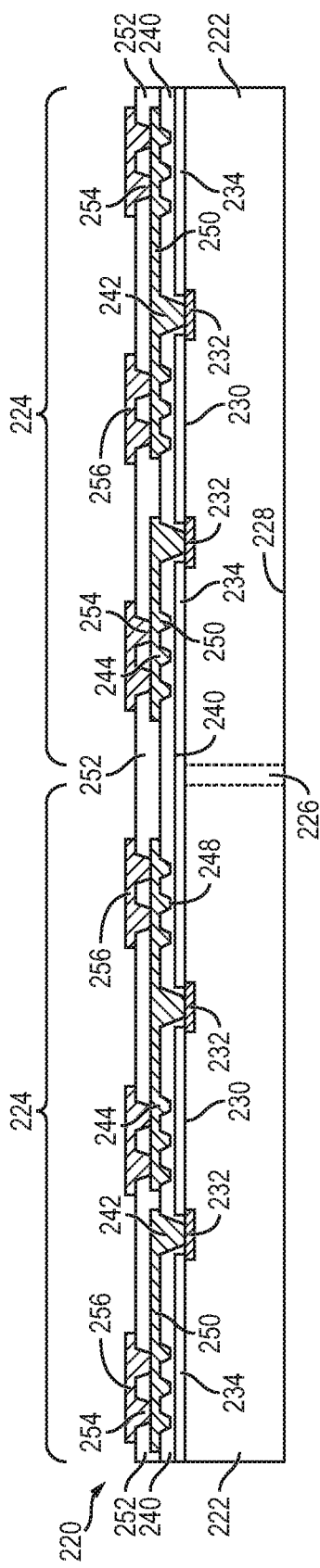

In FIG. 8*d*, an insulating or passivation layer 252 is formed over insulating layer 240 and conductive layer 250 using PVD, CVD, printing, lamination, spin coating, or spray coating. The insulating layer 252 contains one or more layers of SiO2, Si3N4, SiON, Ta2O5, Al2O3, or other material having similar insulating and structural properties. A portion of insulating layer 252 is removed by an exposure or development process, LDA, etching, or other suitable process to form a plurality of grooves or vias 254. The depth of grooves 254 is equal to the thickness of insulating layer 252 over conductive layer 250. Grooves 254 expose conductive layer 250.

An electrically conductive layer 256 is formed over insulating 252 and within grooves 254 using a deposition process such as sputtering, electrolytic plating, or electroless plating. Conductive layer 256 can be one or more layers of Al, Cu, Sn, Ni, Au, Ag, or other suitable electrically conductive material. Conductive layer 256 is electrically connected to conductive layer 250. In one embodiment, conductive layer 256 is a UBM layer including an adhesion layer, barrier layer, and seed or wetting layer. The adhesion layer is formed over conductive layer 250 and can be Ti, TiN, TiW, Al, or Cr. The barrier layer is formed over the adhesion layer and can be Ni, NiV, Pt, Pd, TiW, or CrCu. The barrier layer inhibits the diffusion of Cu. The seed layer is formed over the barrier layer and can be Cu, Ni, NiV, Au, or Al. UBM 256 provides a low resistive interconnect to conductive layer 250, as well as a barrier to solder diffusion and a seed layer for solder wettability.

Conductive layer 256 is disposed in grooves 254 around portions of insulating layer 252 to create a dampening structure in insulating layer 252. The location of the dampening structures, i.e., grooves 254, is selected to correspond to the location of bump formation. Grooves 254 can be patterned to form a dampening structure having a honeycomb, ring, circular, or other shape pattern, similar to FIGS. 3l-3n. Grooves 254 increase the size or area of the contact surface between conductive layer 256 and insulating layer 252 resulting in better bonding strength. The dampening structure reduces defects caused by physical and mechanical stress. The dampening structure formed in insulating layer 252 also reduces thermal stress, for example, stress caused by CTE mismatch, by redistributing and dissipating the cycling energy and to improve TCoB.

Figure 8E:
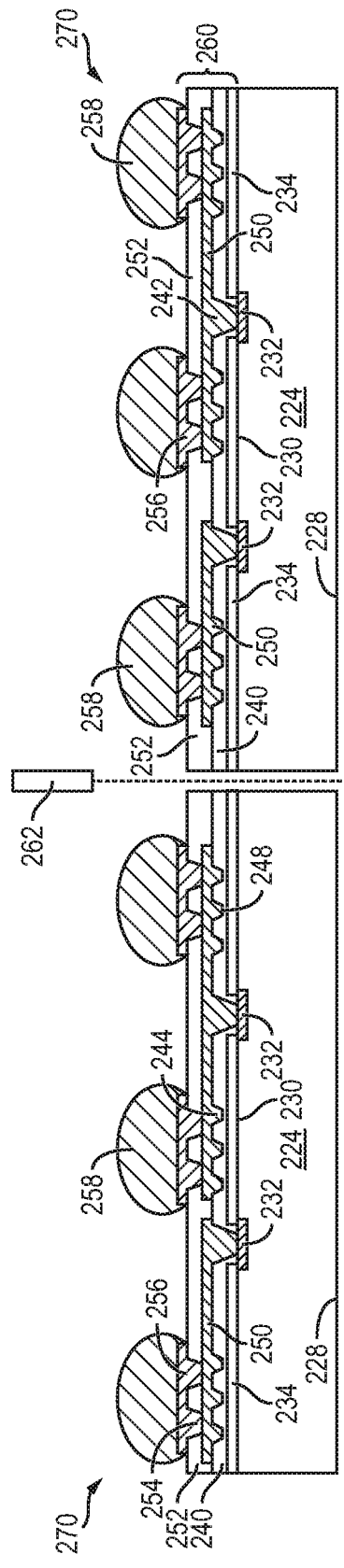

In FIG. 8e, an electrically conductive bump material is deposited over conductive layer 256 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 256 using a suitable attachment or bonding process. In one embodiment, the bump material is reflowed by heating the material above the material's melting point to form balls or bumps 258. In some applications, bumps 258 are reflowed a second time to improve electrical contact to conductive layer 256. Bumps 258 can also be compression bonded or thermocompression bonded to conductive layer 256. Bumps 258 represent one type of interconnect structure that can be formed over conductive layer 256. The interconnect structure can also use bond wires, conductive paste, stud bump, micro bump, or other electrical interconnect.

Taken together, insulating layers 240 and 252, conductive layers 250 and 256, and conductive bumps 258 form a build-up interconnect structure 260. The number of insulating and conductive layers included within interconnect structure 260 depends on, and varies with, the complexity of the circuit routing design. Accordingly, interconnect structure 260 can include any number of insulating and conductive layers to facilitate electrical interconnect with respect to semiconductor die 224. A dampening structure, i.e., grooves, may be formed in any or all of the insulating layers in build-up interconnect structure 260.

Figure 9:
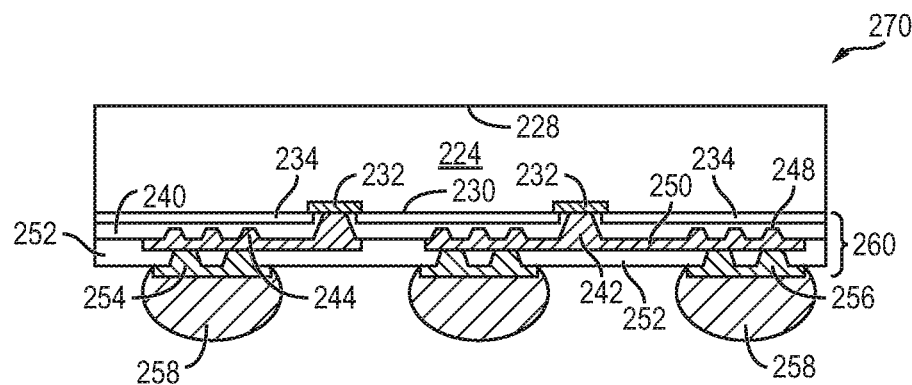
FIG. 9 illustrates the fan-in WLCSP with a dampening structure formed under the bumps in accordance with FIGS. 8a-8e.

Wafer 220 is singulated through interconnect structure 260 and saw street 226 using a saw blade or laser cutting tool 262 into individual fan-in WLCSP 270. FIG. 9 shows fan-in WLCSP 270 after singulation. Contact pads 232 on active surface 230 of semiconductor die 224 are electrically connected through conductive layers 250 and 256 to bumps 258 for external interconnect. Fan-in WLCSP 270 may undergo electrical testing before or after singulation. Conductive layer 250 is disposed in grooves 244 around portions of insulating layer 240. Conductive layer 256 is disposed in grooves 254 around portions of insulating layer 252. The portions of conductive layers 250 and 256 disposed in grooves 244 and grooves 254 create a dampening structure in build-up interconnect structure 260 under bumps 258. The dampening structure reduces vibration caused by physical and mechanical stress. Grooves 244 allow conductive layer 250 to be thicker under bumps 258. The increased thickness of conductive layer 250 increases package reliability. Grooves 244 increase the size or area of the contact surface between conductive layer 250 and insulating layer 240. The increased contact surface increases bonding strength between conductive layer 250 and insulating layer 240. The portions of conductive layer 250 disposed in grooves 244 secure conductive layer 250 in place and prevent conductive layer 250 from shifting horizontally, i.e., along a plane parallel to surface 228 of semiconductor die 224. Grooves 254 increase the size or area of the contact surface between conductive layer 256 and insulating layer 252. The increased contact surface increases bonding strength between conductive layer 256 and insulating layer 252, resulting in improved package reliability. The portions of conductive layer 256 disposed in grooves 254 secure conductive layer 256 in place and prevent conductive layer 256 from shifting horizontally, i.e., along a plane parallel to surface 228 of semiconductor die 224. Accordingly, an increased amount of force or physical stress is needed to displace conductive layers 250 and 256, and defects in fan-in WLCSP 270 from physical and mechanical stress are reduced.

The dampening structure also reduces thermal stress, for example, stress caused by CTE mismatch. Disposing conductive layers 250 and 256 in grooves 244 and 254 around portions of insulating layers 240 and 252, respectively, redistributes and dissipates the cycling energy and improves TCoB. Grooves 244 and 254 disposed below bumps 258 redistribute and reduce the thermal and mechanical stress on bumps 258 and conductive layers 250 and 256. The stress relief is particularly useful for large die WLCSP, e.g., WLCSP greater than or equal to 7 mm by 7 mm. Grooves 244 and 254 decrease bump cracking, delamination, and other interconnect defects in fan-in WLCSP 270. The reduction of stress in fan-in WLCSP 270 increases package performance and pass rates for packages undergoing TCoB and other BLR tests. The increased package quality and pass rates increases production yield, which lowers overall manufacturing costs.

Figure 10:
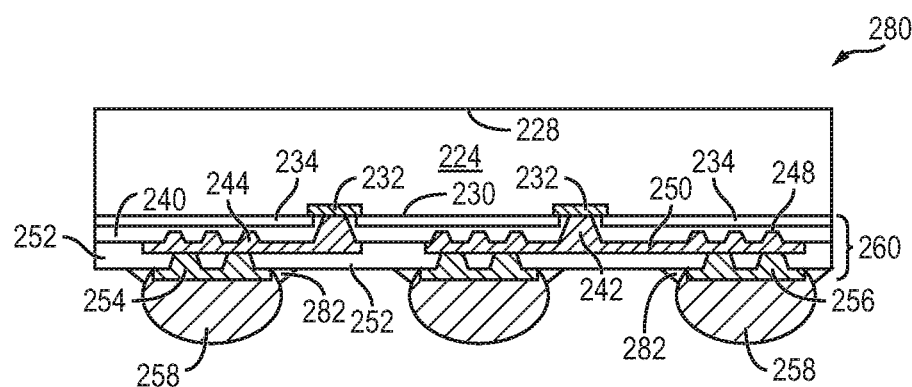
FIG. 10 illustrates another fan-in WLCSP with a dampening structure and polymer support layer.

FIG. 10 shows an embodiment of fan-in WLCSP 280, similar to FIGS. 8a-8e, with an insulating layer 282 formed over insulating layer 252 around bumps 258. In one embodiment, insulating layer 282 is a flux residue polymer. Insulating layer 282 provides additional structural support for bumps 258. Insulating layer 282 extends from bumps 258 to insulating layer 252. Bumps 258 are electrically connected through conductive layers 250 and 256 to conductive layer 232 on active surface 230 of semiconductor die 224. Insulating layer 282 formed around bumps 258 provides additional stress relief for bumps 258 by redistributing the stress profile to reduce cracking and other interconnect defects.

Conductive layer 250 is disposed in grooves 244 around portions of insulating layer 240. Conductive layer 256 is disposed in grooves 254 around portions of insulating layer 252. The portions of conductive layers 250 and 256 disposed in grooves 244 and grooves 254 create a dampening structure in build-up interconnect structure 260 under bumps 258. The dampening structure reduces vibration caused by physical and mechanical stress. Grooves 244 allow conductive layer 250 to be thicker under bumps 258. The increased thickness of conductive layer 250 increases package reliability. Grooves 244 increase the size or area of the contact surface between conductive layer 250 and insulating layer 240. The increased contact surface increases bonding strength between conductive layer 250 and insulating layer 240. The portions of conductive layer 250 disposed in grooves 244 secure conductive layer 250 in place and prevent conductive layer 250 from shifting horizontally, i.e., along a plane parallel to surface 228 of semiconductor die 224. Grooves 254 increase the size or area of the contact surface between conductive layer 256 and insulating layer 252. The increased contact surface increases bonding strength between conductive layer 256 and insulating layer 252, resulting in improved package reliability. The portions of conductive layer 256 disposed in grooves 254 secure conductive layer 256 in place and prevent conductive layer 256 from shifting horizontally, i.e., along a plane parallel to surface 228 of semiconductor die 224. Accordingly, an increased amount of force or physical stress is needed to displace conductive layers 250 and 256, and defects in fan-in WLCSP 270 from physical and mechanical stress are reduced.

The dampening structure also reduces thermal stress, for example, stress caused by CTE mismatch. Disposing conductive layers 250 and 256 in grooves 244 and 254 and around portions of insulating layers 240 and 252, respectively, redistributes and dissipates the cycling energy and improves TCoB. Grooves 244 and 254 disposed below bumps 258 redistribute and reduce the thermal and mechanical stress on bumps 258 and conductive layers 250 and 256. The stress relief is particularly useful for large die WLCSP, e.g., WLCSP greater than or equal to 7 mm by 7 mm. Grooves 244 and 254 decrease bump cracking, delamination, and other interconnect defects in fan-in WLCSP 280. The reduction of stress in fan-in WLCSP 280 increases package performance and pass rates for packages undergoing TCoB and other BLR tests. The increased package quality and pass rates increases production yield, which lowers overall manufacturing costs.

Figure 11A:
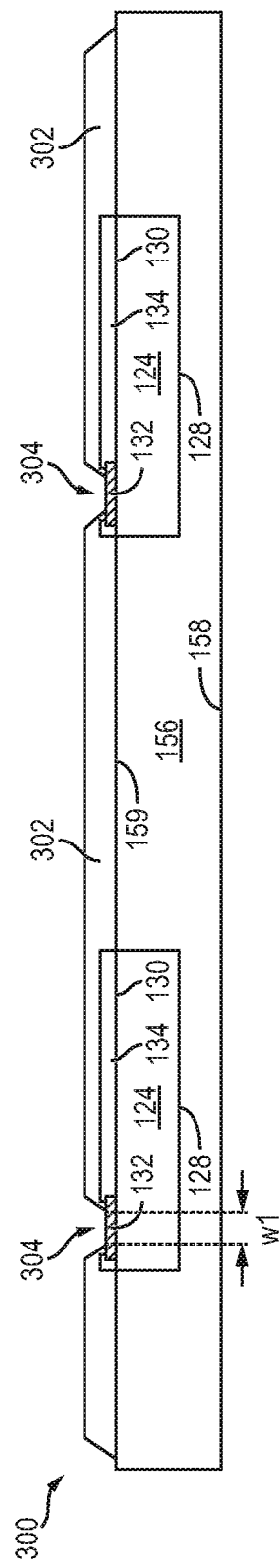

FIG. 11a continues from FIG. 3d. FIG. 11a shows reconstituted wafer 300, similar to reconstituted wafer 154 but with passivation or insulating layer 302. Alternatively, reconstituted wafer 300 could be Si wafer. In FIG. 11a, an insulating or passivation layer 302 is formed over semiconductor die 124 and surface 159 of encapsulant 156 using PVD, CVD, printing, lamination, spin coating, slit or spray coating. Insulating layer 302 contains one or more layers of SiO2, Si3N4, SiON, Ta2O5, Al2O3, polymer dielectric, such as polyimide, PBO, phenolic resin, cyclic olefin polymer resin, epoxy resin, or other material having similar insulating and structural properties. A portion of insulating layer 302 is removed by an exposure or development process, LDA, etching, or other suitable process to form openings or vias 304 over conductive layer 132. Openings 304 extend completely through insulating layer 302 and expose a surface of conductive layer 132. Openings 304 have a width of w1.

Figure 11B:
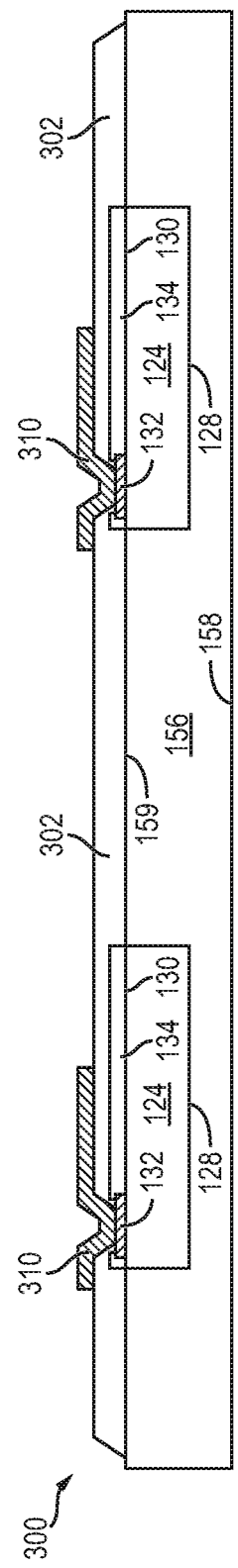

In FIG. 11b, an electrically conductive layer 310 is formed over insulating layer 302 and within openings 304 using a deposition process such as sputtering, electrolytic plating, or electroless plating. Conductive layer 310 can be one or more layers of Ti, TiW, Al, Cu, Sn, Ni, Au, Ag, or other suitable electrically conductive material. Conductive layer 310 operates as an RDL formed over semiconductor die 124. RDL 310 provides a conductive path extending from conductive layer 132 to other areas above semiconductor die 124 and encapsulant 156 for bump formation and external interconnect. One portion of conductive layer 310 is electrically connected to conductive layer 132. Other portions of conductive layer 310 can be electrically common or electrically isolated depending on the design and function of semiconductor die 124. Conductive layer 310 may include a round or circular shape, or other shape per design for electrical or mechanical purpose, over conductive layer 132 and insulating layer 302. In one embodiment, the thickness of RDL 310 is greater than or equal to 6 μm. In another embodiment, the thickness of RDL 310 is about 4 μm, meaning that the thickness of RDL 310 is greater than 3 μm but less than 5 μm.

Figure 11C:
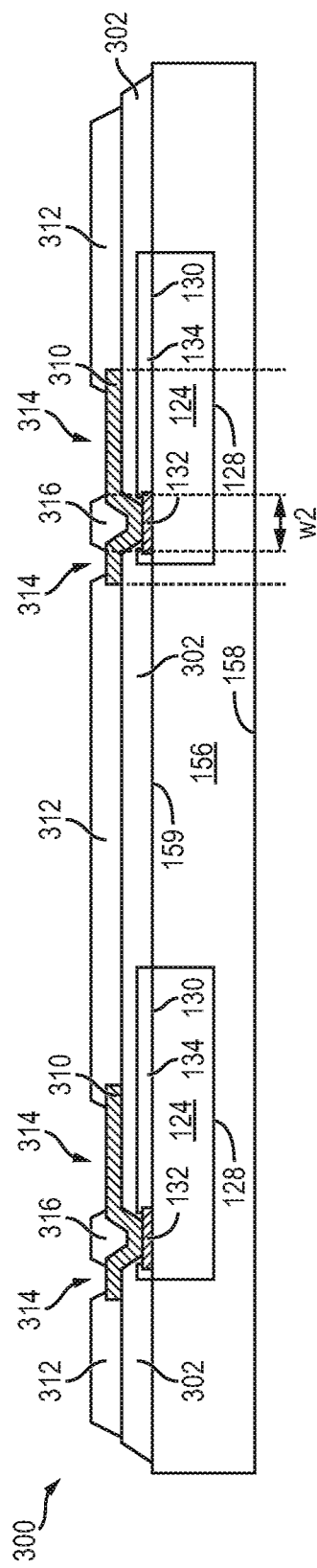

In FIG. 11c, an insulating or passivation layer 312 is formed over RDL 310 and insulating layer 302 using PVD, CVD, printing, lamination, spin coating, slit, or spray coating. Insulating layer 312 contains one or more layers of SiO2, Si3N4, SiON, Ta2O5, Al2O3, or other material having similar insulating and structural properties. In one embodiment, insulating layer 312 is a compliant dielectric material of polymer dielectric, like polyimide, PBO, phenolic resin, cyclic olefin polymer resin, epoxy resin, or other material having similar insulating and structural properties. A portion of insulating layer 312 is removed by an exposure or development process, LDA, etching, or other suitable process to form openings or vias 314 over conductive layer 310. Openings 314 extend completely through insulating layer 312 and expose a surface of conductive layer 310. Openings 314 in insulating layer 312 may expose a round or circular portion of conductive layer 310. Adjacent openings 314 form islands 316 of insulating layer 312 over RDL 310 and conductive layer 132. Islands 316 of insulating layer 312 have a width of w2. Width w2 of islands 316 of insulating layer 312 is greater than width w1 of openings 304 in insulating layer 302. In one embodiment, islands 316 of insulating layer 312 are formed directly above and aligned with openings 304 in insulating layer 302 which expose conductive layer 132. Accordingly, in one embodiment, islands 316 of insulating layer 312 are formed directly above and aligned with conductive layer 132. Island 316 may be formed in a round or circular shape over RDL 310, conductive layer 132, and insulating layer 302. Island 316 is smaller than the round or circular portion of conductive layer 310 exposed by openings 314 in insulating layer 312 over conductive layer 132 and insulating layer 302. In one embodiment, island 316 is off center above the round or circular portion of conductive layer 310 exposed by openings 314 in insulating layer 312 over conductive layer 132 and insulating layer 302. In another embodiment, island 316 is centered above the round or circular portion of conductive layer 310 exposed by openings 314 in insulating layer 312 over conductive layer 132 and insulating layer 302. In another embodiment, area 316 may be a peninsula to cover over 132.

Figure 11D:
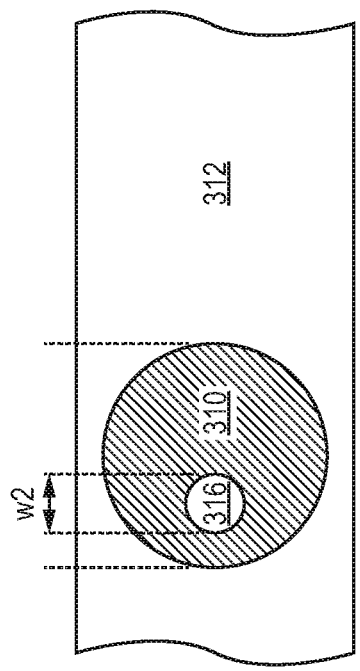

FIG. 11d shows a top down view of a portion of reconstituted wafer 300. FIG. 11d shows a donut or ring shaped opening in insulating layer 312 over conductive layer 132 and insulating layer 302. In the embodiment shown in FIG. 11d, island 316 is off center above the round or circular portion of conductive layer 310 exposed by openings 314 in insulating layer 312 over conductive layer 132 and insulating layer 302.

FIG. 11e shows a corrugated conductive layer or UBM 318 formed over insulating layer 312, islands 316, and RDL 310. Corrugated UBM 318 is formed in vias 314 and directly contacts RDL 310. UBM 318 can be a multiple metal stack with adhesion layer, barrier layer, and seed or wetting layer. The adhesion layer is formed over RDL 310, islands 316, and insulating layer 312 and can be titanium (Ti), or TiN, TiW, Al, or Cr. The barrier layer is formed over the adhesion layer and can be made of Ni, NiV, Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between RDL 310 and subsequent solder bumps or other interconnect structure. UBM 318 provides a low resistive interconnect to RDL 310 as well as a barrier to solder diffusion and seed layer for solder wettability.

In one embodiment, corrugated UBM 318 is conformally applied to, and follows the contours of, insulating layer 312, islands 316, and RDL 310 forming grooves or micro vias 320 over vias 314 of insulating layer 312. In another embodiment, a portion of UBM 318 is removed by an exposure or development process, LDA, etching, or other suitable process to form a plurality of grooves or micro vias 320. The depth of grooves 320 is less than the thickness of corrugated UBM 318. A portion of corrugated UBM 318 remains between a bottom surface of grooves 320 and surface of RDL 310. Grooves 320 do not expose RDL 310 or insulating layer 312.

In FIG. 11f, an electrically conductive bump material is deposited over UBM 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 318 using a suitable attachment or bonding process. In one embodiment, the bump material is reflowed by heating the material above the material's melting point to form balls or bumps 322. In some applications, bumps 322 are reflowed a second time to improve electrical contact to UBM 318. Bumps 322 can also be compression bonded or thermocompression bonded to UBM 318. Bumps 322 represent one type of interconnect structure that can be formed over UBM 318. The interconnect structure can also use stud bump, micro bump, or other electrical interconnect. In another embodiment, electrical interconnect 322 may be pillar or column shape to next level interconnection.

Taken together, insulating layers 302 and 312, conductive layers 310 and 318, and conductive bumps 322 form a build-up interconnect structure 324. The number of insulating and conductive layers included within interconnect structure 324 depends on, and varies with, the complexity of the circuit routing design. Accordingly, interconnect structure 324 can include any number of insulating and conductive layers to facilitate electrical interconnect with respect to semiconductor die 124. A dampening structure, i.e., grooves, may be formed in any or all of the insulating layers in build-up interconnect structure 324.

Reconstituted wafer 300 is singulated through encapsulant 156 and build-up interconnect structure 324 using a saw blade or laser cutting tool 326 into individual fan-out WLCSP 330. FIG. 12 shows fan-out WLCSP 330 after singulation. Semiconductor die 124 is electrically connected through conductive layers 310 and 318 to bumps 322 for external interconnect. Bumps 322 are disposed in grooves 320 in UBM 318. Width w2 of islands 316 of insulating layer 312 is greater than width w1 of openings 304 in insulating layer 302. Insulating layer 312 is a compliant dielectric material. Islands 316 of compliant insulating layer 312 provide stress relief to stacked vias over conductive layer 132. Accordingly, maximum von Mises stress locations are shifted away from RDL 310 via bottom.

FIG. 13a continues from FIG. 3d. FIG. 13a shows reconstituted wafer 332, similar to reconstituted wafer 300. In one embodiment, reconstituted wafer 332 may be Si wafer only. In FIG. 13a, an insulating or passivation layer 302 is formed over semiconductor die 124 and surface 159 of encapsulant 156 using PVD, CVD, printing, lamination, spin coating, or spray coating. Insulating layer 302 contains one or more layers of SiO2, Si3N4, SiON, Ta2O5, Al2O3, polymer dielectric, such as polyimide, PBO, phenolic resin, cyclic olefin polymer resin, epoxy resin, or other material having similar insulating and structural properties. A portion of insulating layer 302 is removed by an exposure or development process, LDA, etching, or other suitable process to form openings or vias 304 over conductive layer 132. Openings 304 extend completely through insulating layer 302 and expose a surface of conductive layer 132. Openings 304 have a width of w3.

In FIG. 13a, an electrically conductive layer 310 is formed over insulating layer 302 and within openings 304 using a deposition process such as sputtering, electrolytic plating, or electroless plating. Conductive layer 310 can be one or more layers of Ti, TiW, Al, Cu, Sn, Ni, Au, Ag, or other suitable electrically conductive material. Conductive layer 310 operates as an RDL formed over semiconductor die 124. RDL 310 provides a conductive path extending from conductive layer 132 to other areas above semiconductor die 124 and encapsulant 156 for bump formation and external interconnect. One portion of conductive layer 310 is electrically connected to conductive layer 132. Other portions of conductive layer 310 can be electrically common or electrically isolated depending on the design and function of semiconductor die 124. Conductive layer 310 may include a round or circular shape, other shape over conductive layer 132 and insulating layer 302. In one embodiment, the thickness of RDL 310 is greater than or equal to 6 μm. In another embodiment, the thickness of RDL 310 is about 4 μm, meaning that the thickness of RDL 310 is greater than 3.5 μm but less than 4.5 μm.

In FIG. 13b, an insulating or passivation layer 312 is formed over RDL 310 and insulating layer 302 using PVD, CVD, printing, lamination, spin coating, slit, or spray coating. Insulating layer 312 contains one or more layers of SiO2, Si3N4, SiON, Ta2O5, Al2O3, or other material having similar insulating and structural properties. In one embodiment, insulating layer 312 is a compliant dielectric material of polymer dielectric, such as polyimide, PBO, phenolic resin, cyclic olefin polymer resin, or epoxy resin. A portion of insulating layer 312 is removed by an exposure or development process, LDA, etching, or other suitable process to form openings or vias 334 over conductive layer 310. Openings 334 extend completely through insulating layer 312 and expose a surface of conductive layer 310. Openings 334 in insulating layer 312 may expose a round or circular portion of conductive layer 310.

FIG. 13c shows a conductive layer or UBM 336 formed over insulating layer 312 and RDL 310. UBM 336 is formed in vias 334 and directly contacts RDL 310. UBM 336 can be a multiple metal stack with adhesion layer, barrier layer, and seed or wetting layer. The adhesion layer is formed over RDL 310 and insulating layer 312 and can be Ti, or TiN, TiW, Al, or Cr. The barrier layer is formed over the adhesion layer and can be made of Ni, NiV, Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between RDL 310 and subsequent solder bumps or other interconnect structure. UBM 336 provides a low resistive interconnect to RDL 310 as well as a barrier to solder diffusion and seed layer for solder wettability. UBM 336 is formed in a ring or donut shape around a perimeter of opening 338 and over insulating layer 312. A central portion of opening 338 is left devoid of UBM 336. A portion of RDL 310 remains exposed after UBM 336 is disposed in via 338. The portion of RDL 310 which remains exposed after UBM 336 is disposed in via 338 may be circular or round shaped.

FIG. 13d shows a top down view of a portion of reconstituted wafer 332. FIG. 13d shows a ring or donut shaped UBM 336 formed over insulating layer 312 and conductive layers 310 and 336. In the embodiment shown in FIG. 13d, the portion of RDL 310 which remains exposed after UBM 336 is disposed in via 338 is off center with respect to UBM 336. The portions of RDL 310 which remains exposed after UBM 336 is disposed in vias 338 have a width of w4. Width w4 of the portions of RDL 310 which remain exposed after UBM 336 is disposed in vias 338 is greater than width w3 of openings 304 in insulating layer 302. In one embodiment, the portion of RDL 310 which remains exposed after UBM 336 is disposed in via 338 is directly above and aligned with openings 304 in insulating layer 302 which expose conductive layer 132. Accordingly, in one embodiment, the portion of RDL 310 which remains exposed after UBM 336 is disposed in via 338 of insulating layer 312 is formed directly above and aligned with conductive layer 132. In one embodiment, the portion of RDL 310 which remains exposed after UBM 336 are disposed in via 338 is off center with respect to UBM 336. In another embodiment, the portion of RDL 310 which remains exposed after UBM 336 is disposed in via 338 is centered with respect to UBM 336.

In FIG. 13e, an electrically conductive bump material is deposited over UBM 336 and RDL 310 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 336 and RDL 310 using a suitable attachment or bonding process. In one embodiment, the bump material is reflowed by heating the material above the material's melting point to form balls or bumps 322. In some applications, bumps 322 are reflowed a second time to improve electrical contact to UBM 336 and RDL 310. Bumps 322 can also be compression bonded or thermocompression bonded to UBM 336 and RDL 310. Bumps 322 represent one type of interconnect structure that can be formed over UBM 336 and RDL 310. The interconnect structure can also use stud bump, micro bump, or other electrical interconnect.

Taken together, insulating layers 302 and 312, conductive layers 310 and 336, and conductive bumps 322 form a build-up interconnect structure 340. The number of insulating and conductive layers included within interconnect structure 340 depends on, and varies with, the complexity of the circuit routing design. Accordingly, interconnect structure 340 can include any number of insulating and conductive layers to facilitate electrical interconnect with respect to semiconductor die 124. A dampening structure, i.e., grooves, may be formed in any or all of the insulating layers in build-up interconnect structure 340.

Reconstituted wafer 332 is singulated through encapsulant 156 and build-up interconnect structure 340 using a saw blade or laser cutting tool 342 into individual fan-out WLCSP 344. FIG. 14 shows fan-out WLCSP 344 after singulation. Semiconductor die 124 is electrically connected through conductive layers 310 and 336 to bumps 322 for external interconnect. Width w4 of the portions of RDL 310 which remain exposed after UBM 336 is disposed in vias 338 is greater than width w3 of openings 304 in insulating layer 302. UBM 336 is formed in a ring or donut shape around a perimeter of opening 338 and over insulating layer 312. A central portion of opening 338 is left devoid of UBM 336. A portion of RDL 310 remains exposed after UBM 336 is disposed in via 338. Removing UBM 336 over vias 304 in insulating material 302 minimizes high modulus copper over vias 304. Removing UBM 336 over vias 304 in insulating material 302 means only solder 322 is formed over RDL 310 and directly over conductive layer 132, which minimizes stress. Accordingly, maximum von Mises stress locations are shifted away from RDL 310 via bottom.

Figure 15A:
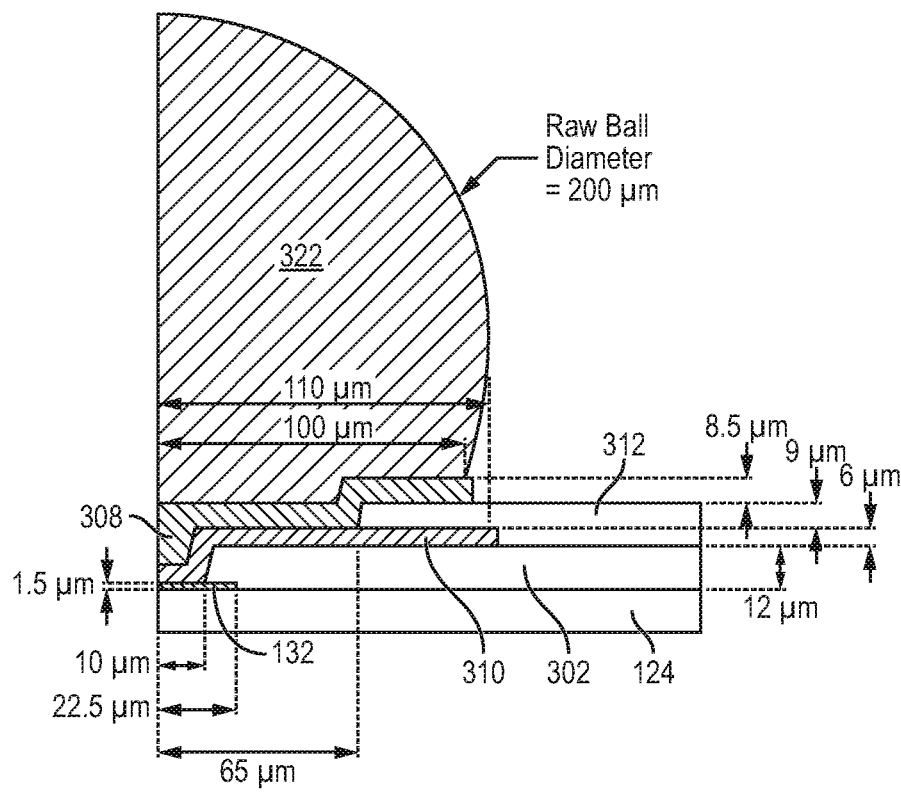
FIGS. 15a-15f illustrate alternative layouts for conductive and insulating layers in a fan-out WLCSP.
Figure 15B:
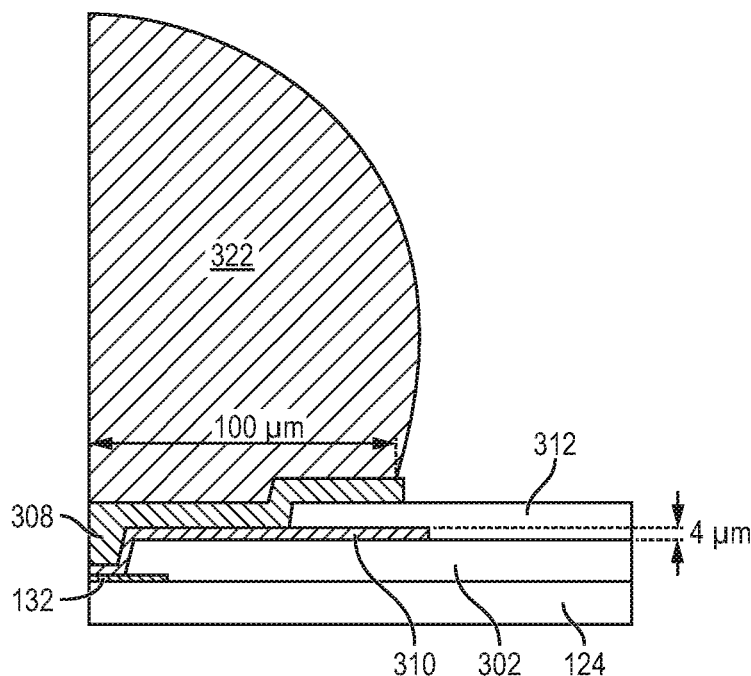
Figure 15C:
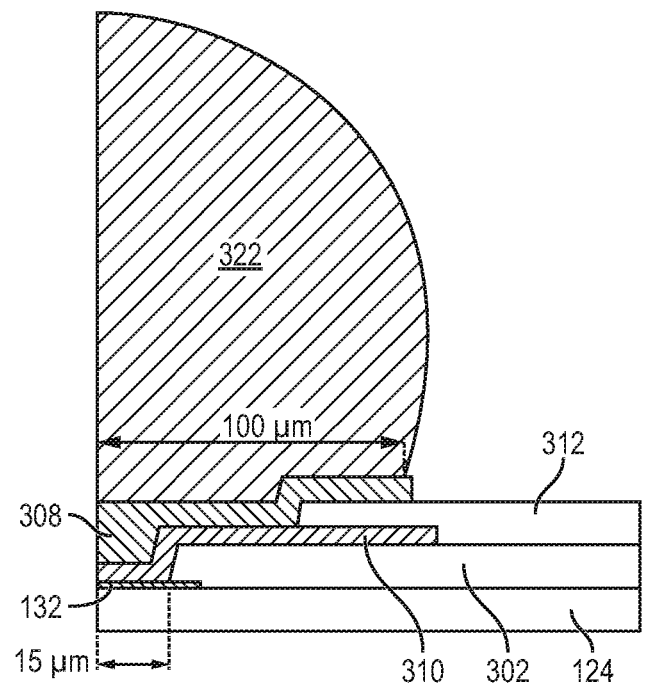

FIGS. 15a-15f show six metal layer stack configurations which are modeled and evaluated. In FIGS. 15a-15c, the reference number 308 refers to a UBM layer generally, as described above.

Table 1 shows von Mises Stress at monitor output node according to simulations run on each of the configurations shown in FIGS. 15a-15f.

TABLE 1

Figure 15D:
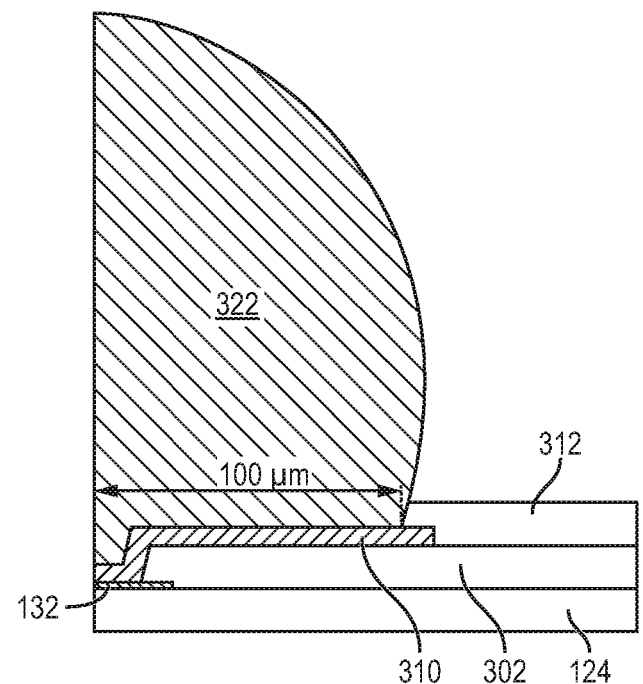
Figure 15E:
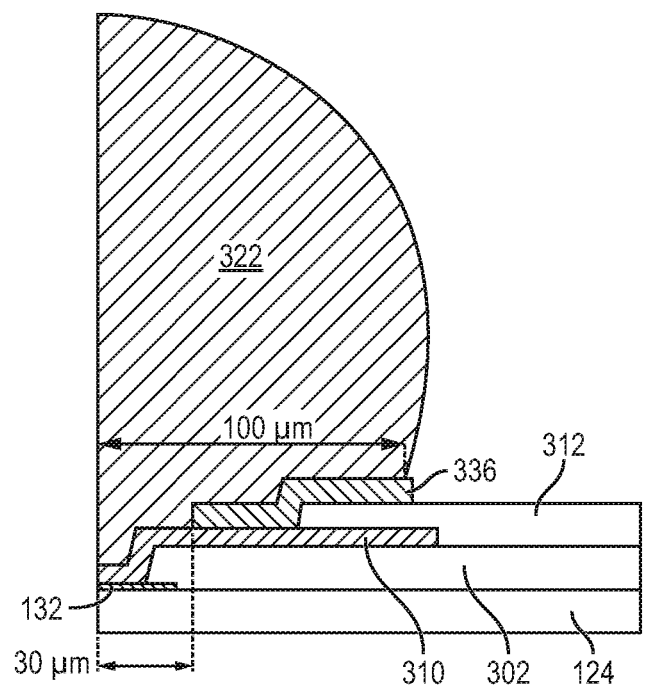
Figure 15F:
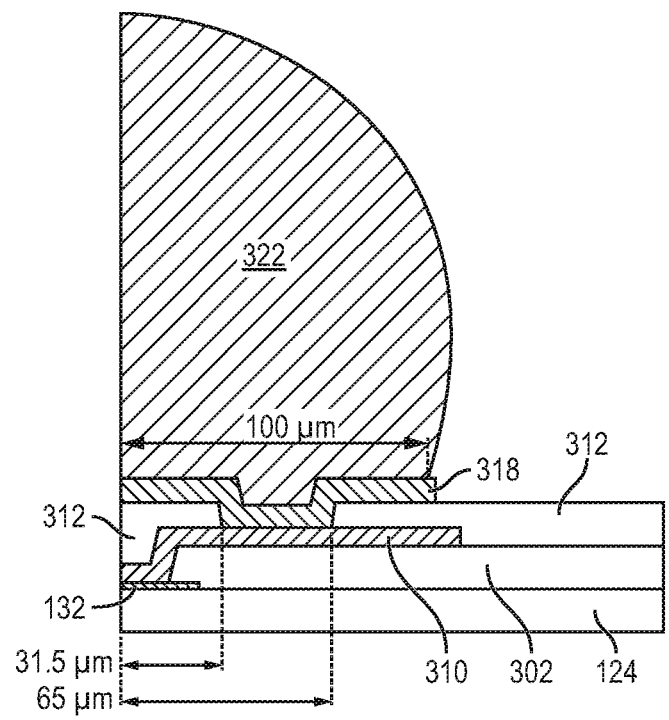

| | von Mises Stress at monitor output nodes | | | | | |
|---|---|---|---|---|---|---|
| Item | FIG. 15a (Baseline) | FIG. 15b | FIG. 15c | FIG. 15d | FIG. 15e | FIG. 15f |
| RDL 310 Thickness | 6 μm | 4 μm | 6 μm | 6 μm | 6 μm | 6 μm |
| Via 304 Opening Size | 20 μm | 20 μm | 30 μm | 20 μm | 20 μm | 20 μm |
| 312 Via Opening Size | 130 μm | 130 μm | 130 μm | 200 μm | 130 μm | OD/ID = 130/63 μm |
| UBM Size and Shape | 200 μm | 200 um | 200 μm | 0 μm | 200 μm (Donut shape with 60 um hollow) | 200 μm (Corrugated shape with island of 63 um in diameter) |
| von Mises Stress at monitor output node | 830.4 MPa | 887.9 MPa | 784.7 MPa | 815.1 MPa | 812.0 MPa | 626.8 MPa |
| Variation | — | +6.9% | −5.5% | −1.8% | −2.2% | −24.5% |

Figure 16:
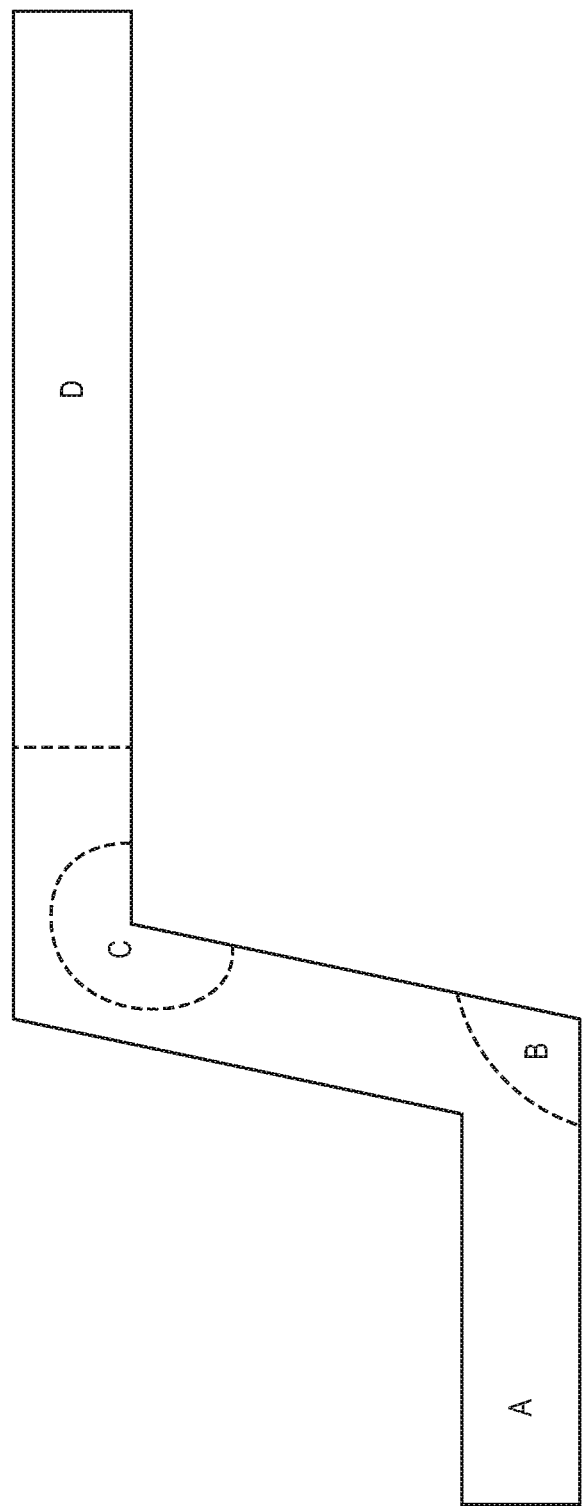
FIG. 16 illustrates a portion of a conductive layer with regions A, B, C, and D marked for reference.

FIG. 16 shows a portion of RDL 310 with regions A, B, C, and D marked for reference. Table 2 shows the von Mises Stress on RDL 310 in regions of RDL 310 shown in FIG. 16 for selected configurations.

TABLE 2 von Mises Stress ranges at RDL

| Region of RDL 310 | FIG. 15a | FIG. 15b | FIG. 15c | FIG. 15d | FIG. 15e | FIG. 15f |
|---|---|---|---|---|---|---|
| A | 3.777-5.389 | 3.794-6.105 | 3.730-5.601 | 3.815-6.180 | 3.750-6.196 | 3.374-6.195 |
| B | 4.986-7.001 | 4.719-7.492 | 4.479-6.724 | 4.604-6.968 | 4.565-7.012 | 4.180-5.389 |
| C | 4.180-7.404 | 4.256-7.030 | 4.104-6.724 | 4.604-7.757 | 4.565-7.012 | 3.777-7.001 |
| D | 3.374-4.180 | 30332-4.256 | 3.356-4.104 | 3.421-4.209 | 3.342-4.158 | 3.374-6.195 |

FIG. 16 and Table 2 show maximum von Mises stress locations for the embodiment shown in FIG. 15e and the embodiment shown in FIG. 15f are shifted away from the RDL via bottom. The embodiment shown in FIG. 15e is also shown in FIG. 14. The embodiment shown in FIG. 15f is also shown in FIG. 12. Accordingly, maximum von Mises stress locations for the embodiments shown in FIGS. 12 and 14 are shifted away from the RDL via bottoms.

Figure 17A:
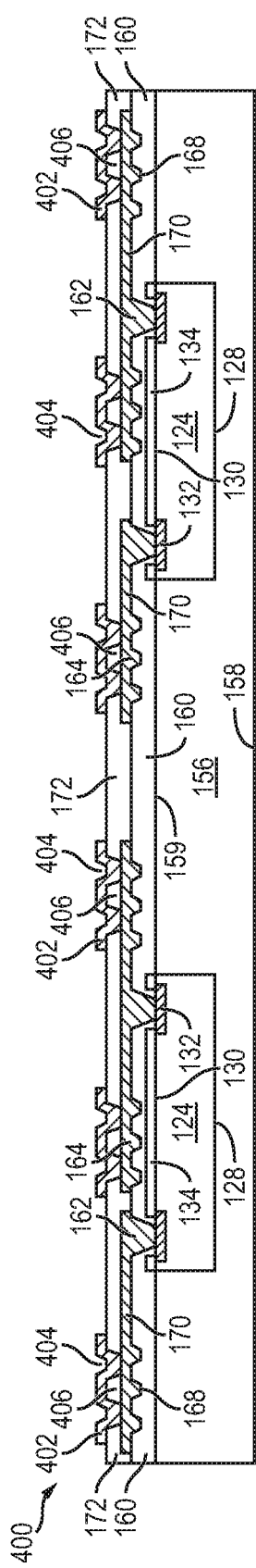
FIGS. 17a-17b illustrate another method of forming a compliant island in a fan-out WLCSP.

FIG. 17a continues from FIG. 3j. FIG. 17a shows reconstituted wafer 400, similar to reconstituted wafer 154 of FIG. 3j but with islands 406 of insulating layer 172. In FIG. 17a, an electrically conductive layer 402 is formed over insulating layer 172, including islands 406, and within grooves 174 using a deposition process such as sputtering, electrolytic plating, or electroless plating. Conductive layer 402 can be one or more layers of Al, Cu, Sn, Ni, Au, Ag, or other suitable electrically conductive material. Conductive layer 402 is electrically connected to conductive layer 170. In one embodiment, conductive layer 402 is a multi-layer stack UBM layer including an adhesion layer, barrier layer, and seed or wetting layer. The adhesion layer is formed over conductive layer 170 and can be Ti, TiN, TiW, Al, or Cr. The barrier layer is formed over the adhesion layer and can be Ni, NiV, Pt, Pd, TiW, or CrCu. The barrier layer inhibits the diffusion of Cu. The seed layer is formed over the barrier layer and can be Cu, Ni, NiV, Au, or Al. UBM 402 provides a low resistive interconnect to conductive layer 170, as well as a barrier to solder diffusion and a seed layer for solder wettability.

Conductive layer 402 is disposed in grooves 174 around portions of insulating layer 172 and over islands 406 to create a dampening structure in insulating layer 172. The location of the dampening structures, i.e., grooves 174, is selected to correspond to the location of bump formation. Grooves 174 increase the size or area of the contact surface between conductive layer 402 and insulating layer 172 resulting in increased bonding strength. The dampening structure reduces defects caused by physical and mechanical stress. The dampening structure formed in insulating layer 172 also reduces thermal stress, for example, stress caused by CTE mismatch, by redistributing and dissipating the cycling energy and to improve TCoB.

In one embodiment, corrugated UBM 402 is conformally applied to, and follows the contours of, insulating layer 172, islands 406, and conductive layer 170 forming grooves or micro vias 404. In another embodiment, a portion of UBM 402 is removed by an exposure or development process, LDA, etching, or other suitable process to form a plurality of grooves or micro vias 404. The depth of grooves 404 is less than the thickness of corrugated UBM 402. A portion of corrugated UBM 402 remains between a bottom surface of grooves 404 and surface of conductive layer 170. Grooves 404 do not expose conductive layer 170 or insulating layer 172.

Figure 17B:
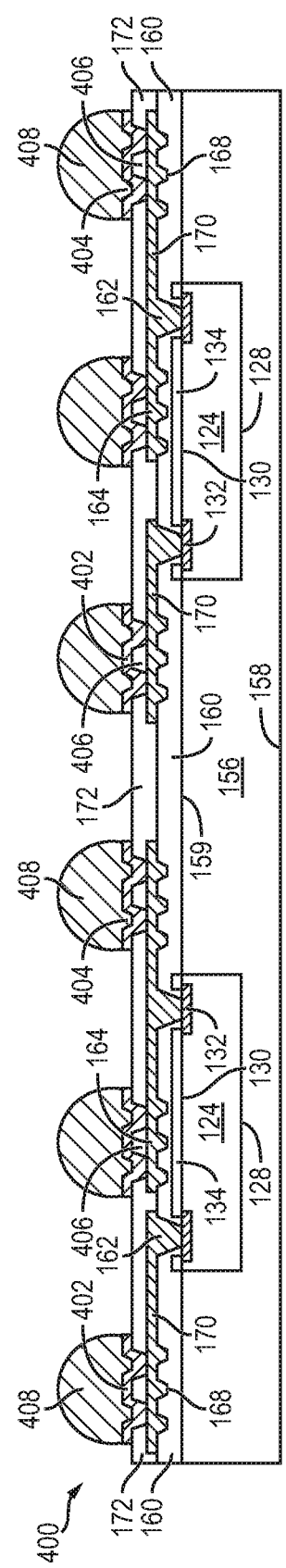

In FIG. 17b, an electrically conductive bump material is deposited over UBM 402 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 404 using a suitable attachment or bonding process. In one embodiment, the bump material is reflowed by heating the material above the material's melting point to form balls or bumps 408. In some applications, bumps 408 are reflowed a second time to improve electrical contact to UBM 402. Bumps 408 can also be compression bonded or thermocompression bonded to UBM 402. Bumps 408 represent one type of interconnect structure that can be formed over UBM 402. The interconnect structure can also use stud bump, micro bump, or other electrical interconnect.

Figure 18:
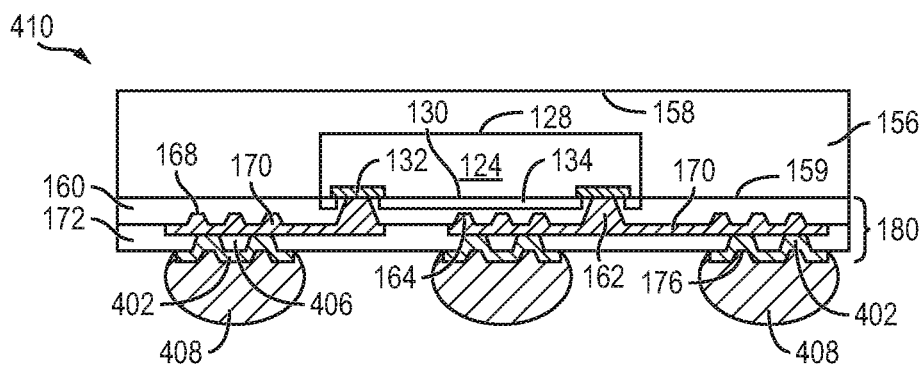
FIG. 18 illustrates the fan-out WLCSP with a compliant island formed under the bumps in accordance with FIGS. 17a-17b.

FIG. 18 shows fan-out WLCSP 410 after singulation of reconstituted wafer 400. Semiconductor die 124 is electrically connected through conductive layers 170 and 402 to bumps 408 for external interconnect. Conductive layer 170 is disposed in grooves 164 around portions of insulating layer 160. Conductive layer 402 is disposed in grooves 174 around portions of insulating layer 172 and over islands 406 of insulating layer 172. The portions of conductive layers 170 and 402 disposed in grooves 164 and grooves 174 create a dampening structure in build-up interconnect structure 180 under a footprint of bumps 408. The dampening structure reduces vibration caused by physical and mechanical stress. Grooves 164 allow conductive layer 170 to be thicker under bumps 408. The increased thickness of conductive layer 170 increases package reliability. Grooves 164 increase the size or area of the contact surface between conductive layer 170 and insulating layer 160. The increased contact surface increases bonding strength between conductive layer 170 and insulating layer 160. The portions of conductive layer 170 disposed in grooves 164 secure conductive layer 170 in place and prevent conductive layer 170 from shifting horizontally, i.e., along a plane parallel to surface 128 of semiconductor die 124. Grooves 174 increase the size or area of the contact surface between conductive layer 402 and insulating layer 172. The increased contact surface increases bonding strength between conductive layer 402 and insulating layer 172 resulting in improved package reliability. The portions of conductive layer 402 disposed in grooves 174 secure conductive layer 402 in place and prevent conductive layer 402 from shifting horizontally, i.e., along a plane parallel to surface 128 of semiconductor die 124. Accordingly, an increased amount of force or physical stress is needed to displace conductive layers 170 and 402, and defects in fan-out WLCSP 410 from physical and mechanical stress are reduced.

The dampening structure also reduces thermal stress, for example, stress caused by CTE mismatch. Disposing conductive layers 170 and 402 in grooves 164 and 174 around portions of insulating layers 160 and 172, respectively, redistributes and dissipates the cycling energy and improves TCoB. Grooves 164 and 174 are disposed below bumps 408 to redistribute and reduce the thermal and mechanical stress on bumps 408 and conductive layers 170 and 402. The stress relief is particularly useful for large die WLCSP, e.g., WLCSP greater than or equal to 7 mm by 7 mm. Grooves 164 and 174 decrease bump cracking, delamination, and other interconnect defects in fan-out WLCSP 410. The reduction of stress in fan-out WLCSP 410 increases package performance and pass rates for packages undergoing TCoB and other BLR tests. The increased package quality and pass rates increase production yield, which lowers overall manufacturing costs. Insulating layer 172 is a compliant dielectric material. Islands 406 of compliant insulating layer 172 provide stress relief to stacked vias. Accordingly, maximum von Mises stress locations are shifted away from conductive layer 170 via bottom.

Figure 19:
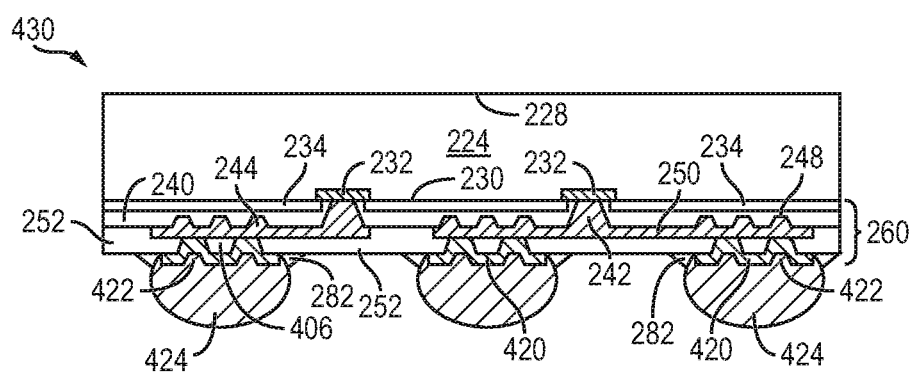
FIG. 19 illustrates another fan-in WLCSP with a dampening structure, polymer support layer, and compliant island.

FIG. 19 shows an embodiment of fan-in WLCSP 430, similar to FIGS. 8a-8e, with an insulating layer 282 formed over insulating layer 252 around bumps 424. In one embodiment, insulating layer 282 is a flux residue polymer. Insulating layer 282 provides additional structural support for bumps 424. Insulating layer 282 extends from bumps 424 to insulating layer 252. Bumps 424 are electrically connected through conductive layers 250 and 420 to conductive layer 232 on active surface 230 of semiconductor die 224. The insulating layer 282 formed around bumps 424 provides additional stress relief for bumps 424 by redistributing the stress profile to reduce cracking and other interconnect defects.

In one embodiment, corrugated UBM 420 is conformally applied to, and follows the contours of, insulating layer 252, islands 406, and conductive layer 250 forming grooves or micro vias 422. In another embodiment, a portion of UBM 420 is removed by an exposure or development process, LDA, etching, or other suitable process to form a plurality of grooves or micro vias 422. The depth of grooves 422 is less than the thickness of corrugated UBM 420. A portion of corrugated UBM 420 remains between a bottom surface of grooves 422 and surface of conductive layer 250. Grooves 422 do not expose conductive layer 250 or insulating layer 252.

Conductive layer 250 is disposed in grooves 244 around portions of insulating layer 240. Conductive layer 256 is disposed in grooves 254 around portions of insulating layer 252. The portions of conductive layers 250 and 420 disposed in grooves 244 and grooves 254 create a dampening structure in build-up interconnect structure 260 under bumps 424. The dampening structure reduces vibration caused by physical and mechanical stress. Grooves 244 allow conductive layer 250 to be thicker under bumps 424. The increased thickness of conductive layer 250 increases package reliability. Grooves 244 increase the size or area of the contact surface between conductive layer 250 and insulating layer 240. The increased contact surface increases bonding strength between conductive layer 250 and insulating layer 240. The portions of conductive layer 250 disposed in grooves 244 secure conductive layer 250 in place and prevent conductive layer 250 from shifting horizontally, i.e., along a plane parallel to surface 228 of semiconductor die 224. Grooves 254 increase the size or area of the contact surface between conductive layer 420 and insulating layer 252. The increased contact surface increases bonding strength between conductive layer 420 and insulating layer 252, resulting in improved package reliability. The portions of conductive layer 420 disposed in grooves 254 secure conductive layer 256 in place and prevent conductive layer 256 from shifting horizontally, i.e., along a plane parallel to surface 228 of semiconductor die 224. Accordingly, an increased amount of force or physical stress is needed to displace conductive layers 250 and 420, and defects in fan-in WLCSP 430 from physical and mechanical stress are reduced.

The dampening structure also reduces thermal stress, for example, stress caused by CTE mismatch. Disposing conductive layers 250 and 420 in grooves 244 and 254 and around portions of insulating layers 240 and 252, respectively, redistributes and dissipates the cycling energy and improves TCoB. Grooves 244 and 254 disposed below bumps 424 redistribute and reduce the thermal and mechanical stress on bumps 424 and conductive layers 250 and 420. The stress relief is particularly useful for large die WLCSP, e.g., WLCSP greater than or equal to 7 mm by 7 mm. Grooves 244 and 254 decrease bump cracking, delamination, and other interconnect defects in fan-in WLCSP 430. The reduction of stress in fan-in WLCSP 430 increases package performance and pass rates for packages undergoing TCoB and other BLR tests. The increased package quality and pass rates increases production yield, which lowers overall manufacturing costs. Insulating layer 252 is a compliant dielectric material. Islands 406 of compliant insulating layer 252 provide stress relief to stacked vias. Accordingly, maximum von Mises stress locations are shifted away from conductive layer 250 via bottom.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   depositing an encapsulant around the semiconductor die;
   disposing a first insulating layer over the semiconductor die and encapsulant;
   forming a via in the first insulating layer over a contact pad of the semiconductor die;
   disposing a first conductive layer over the first insulating layer and into the via;
   disposing a second insulating layer over the first insulating layer and first conductive layer and further extending over the encapsulant; and
   removing a portion of the second insulating layer to form an opening through the second insulating layer while retaining an island of the second insulating layer over a portion of the first conductive layer and extending across the via with a remaining portion of the second insulating layer after removing the portion of the second insulating layer to form the opening overlapping the first conductive layer and extending over the encapsulant, wherein a width of the island is greater than a width of the via and the island is off-center with respect to the opening in the second insulating layer.

2. The method of claim 1, further including disposing a second conductive layer over the first conductive layer, second insulating layer, and island.

3. The method of claim 2, wherein the second conductive layer has a corrugated structure.

4. The method of claim 2, further including disposing a bump over the second conductive layer and the island.

5. The method of claim 1, wherein the island reduces von Mises stress on a portion of the first conductive layer disposed in the via.

6. The method of claim 1, wherein the second insulating layer is a compliant dielectric material.

7. A method of making a semiconductor device, comprising:
- providing a semiconductor die;
- disposing a first insulating layer over the semiconductor die;
- forming a first via in the first insulating layer over a contact pad of the semiconductor die;
- disposing a first conductive layer over the first insulating layer and into the first via;
- disposing a second insulating layer over the first insulating layer and first conductive layer;
- forming a second via in the second insulating layer over the first conductive layer and the first via with no portion of the second insulating layer remaining over the first via; and
- disposing a second conductive layer over the first conductive layer and second insulating layer with an opening in the second conductive layer extending across the first via and further extending to the first conductive layer, wherein a width of the opening is greater than a width of the first via and the second conductive layer contacts the first conductive layer outside the first via and completely around the opening.

8. The method of claim 7, wherein the second conductive layer has a ring or donut shape.

9. The method of claim 7, wherein the opening in the second conductive layer is off-center with respect to the second via.

10. The method of claim 7, further including disposing a bump over the second conductive layer and the first conductive layer.

11. The method of claim 10, wherein the bump contacts the first conductive layer.

12. The method of claim 7, wherein the opening in the second conductive layer is offset with respect to a center of the first conductive layer.

13. A semiconductor device, comprising:
- a semiconductor die;
- a first insulating layer disposed over the semiconductor die;
- a via formed in the first insulating layer over a contact pad of the semiconductor die;
- a first conductive layer disposed over the first insulating layer and in the via;
- a second insulating layer disposed over a portion of the first insulating layer and first conductive layer; and
- an opening formed through the second insulating layer to leave an island of the second insulating layer over a portion of the first conductive layer and extending across the via and a remaining portion of the second insulating layer overlapping the first conductive layer, wherein a width of the island is greater than a width of the via.

14. The semiconductor device of claim 13, further including a second conductive layer disposed over the first conductive layer, second insulating layer, and island.

15. The semiconductor device of claim 14, wherein the second conductive layer has a corrugated structure.

16. The semiconductor device of claim 14, further including a bump disposed over the second conductive layer and the island.

17. The semiconductor device of claim 13, wherein the island is offset with respect to a center of the opening in the second insulating layer.

18. The semiconductor device of claim 13, wherein the island reduces von Mises stress on a portion of the first conductive layer disposed in the via.

19. The method of claim 13, further including an encapsulant deposited around the semiconductor die, wherein the remaining portion of the second insulating layer extends over the encapsulant.

20. A semiconductor device, comprising:
- a semiconductor die;
- a first insulating layer disposed over the semiconductor die;
- a first via formed in the first insulating layer over a contact pad of the semiconductor die;
- a first conductive layer disposed over the first insulating layer and in the first via;
- a second insulating layer disposed over the first insulating layer and first conductive layer;
- a second via formed in the second insulating layer over the first conductive layer and the first via with no portion of the second insulating layer remaining over the first via; and
- a second conductive layer disposed over the first conductive layer and second insulating layer with an opening in the second conductive layer extending across the first via and further extending to the first conductive layer, wherein a width of the opening is greater than a width of the first via and the second conductive layer contacts the first conductive layer outside the first via and completely around the opening.

21. The semiconductor device of claim 20, wherein the second conductive layer has a ring or donut shape.

22. The semiconductor device of claim 20, wherein the opening in the second conductive layer is off-center with respect to the second via.

23. The semiconductor device of claim 20, further including a bump disposed over the second conductive layer and the first conductive layer.

24. The semiconductor device of claim 23, wherein the bump contacts the first conductive layer.

25. The semiconductor device of claim 20, wherein the opening in the second conductive layer is offset with respect to a center of the first conductive layer.

* * * * *